(12) United States Patent
Homza et al.

(10) Patent No.: US 12,464,655 B2
(45) Date of Patent: Nov. 4, 2025

(54) NETWORK DEVICE WITH RECESSED VENTING SURFACE

(71) Applicant: COMCAST CABLE COMMUNICATIONS, LLC, Philadelphia, PA (US)

(72) Inventors: Henry Homza, Philadelphia, PA (US); Erik Stefans, Philadelphia, PA (US); Michael Jou, Philadelphia, PA (US); FangYu Rosenwald, Philadelphia, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 166 days.

(21) Appl. No.: 18/103,574

(22) Filed: Jan. 31, 2023

(65) Prior Publication Data
US 2024/0260209 A1    Aug. 1, 2024

(51) Int. Cl.
*H05K 5/02* (2006.01)
*H05K 7/20* (2006.01)

(52) U.S. Cl.
CPC ....... *H05K 5/0213* (2013.01); *H05K 7/20836* (2013.01)

(58) Field of Classification Search
None
See application file for complete search history.

(56) References Cited

U.S. PATENT DOCUMENTS

| 7,256,996 | B2 | 8/2007 | Egbert et al. | |
| 8,625,977 | B2 | 1/2014 | Cheung | |
| 2003/0054754 | A1* | 3/2003 | H. A. McKee | F24F 13/082 454/367 |
| 2006/0148398 | A1* | 7/2006 | Ruch | H05K 5/0213 454/184 |
| 2015/0096876 | A1* | 4/2015 | Mittleman | H04N 5/77 200/341 |
| 2016/0212884 | A1* | 7/2016 | Ruberto | G06F 1/20 |
| 2021/0072787 | A1* | 3/2021 | Cueto | H05K 7/20 |

* cited by examiner

*Primary Examiner* — Allen L Parker
*Assistant Examiner* — Christopher L Augustin
(74) *Attorney, Agent, or Firm* — Ballard Spahr LLP

(57) ABSTRACT

An apparatus, such as a network device, may include a housing. The housing may include one or more side walls that define a top rim of the housing. The housing may include a top wall. The top wall may be positioned vertically below the top rim. The top wall may have a concave or other shape and include a plurality of apertures configured to provide airflow from the interior of the housing to the exterior even when objects are placed on top of the housing.

19 Claims, 12 Drawing Sheets

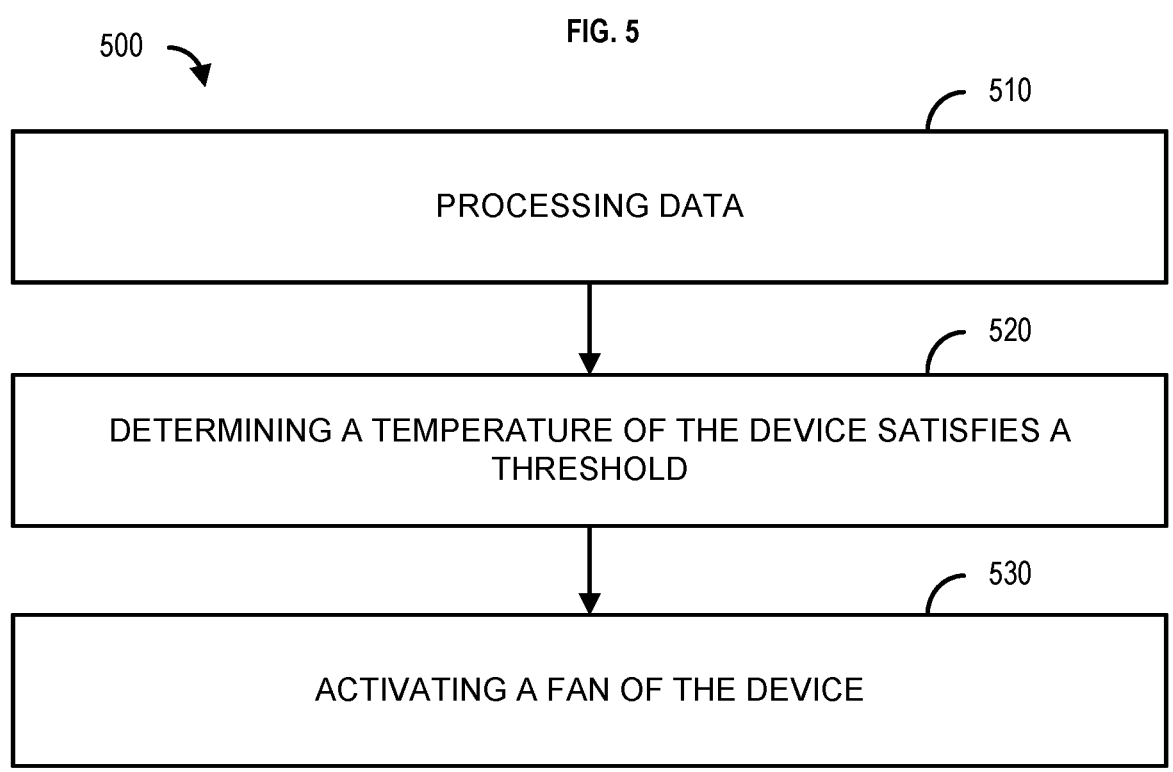

NETWORK DEVICE WITH RECESSED VENTING SURFACE

BACKGROUND

Network devices, such as routers, access points, hubs, switches, bridges, gateways, or modems generate a substantial amount of heat during operation. Conventional network devices may include air vents along a portion of the network device to dissipate the heat from the internal cavity of the networking device. These air vents may be provided along a top side of the network device to take advantage of the fact that the rising heated air will exit the cavity of the network device.

However, users may set things down on the top of the networking device. This may result in the air vents of the networking device being blocked. The blocked air vents may limit or prevent heated air within the cavity of the networking device from dissipating, resulting in damage to the components of the networking device. In an effort to prevent items from being placed on top of the network device, the top side of the network device may be significantly angled, such that items will not remain on the top side of the network device. However, providing angled top sides can result in unused space within the network device and can increase the overall size of the network device.

SUMMARY

It is to be understood that both the following general description and the following detailed description are exemplary and explanatory only and are not restrictive. A network device with a recessed venting surface is shown and described.

A network device may include a housing and an internal cavity. The housing may include a top side that is positioned below the top rim of a side wall of the housing. The top side may include multiple ventilation openings that extend into the internal cavity. The top side may include a concave-shaped top surface. By positioning the top surface below the top end of the side walls of the housing and/or provided a concave shape for the top surface, items placed on the top of the network device may not block at least a portion of the ventilation openings and continue to permit airflow between the internal cavity and the exterior of the housing.

This summary is not intended to identify critical or essential features of the disclosure, but merely to summarize certain features and variations thereof. Other details and features will be described in the sections that follow.

BRIEF DESCRIPTION OF THE DRAWINGS

The accompanying drawings, which are incorporated in and constitute a part of the present description serve to explain the principles of the apparatuses and systems described herein:

FIG. 5 shows a flowchart of an example method for cooling a device.

DETAILED DESCRIPTION

Figure 1A:
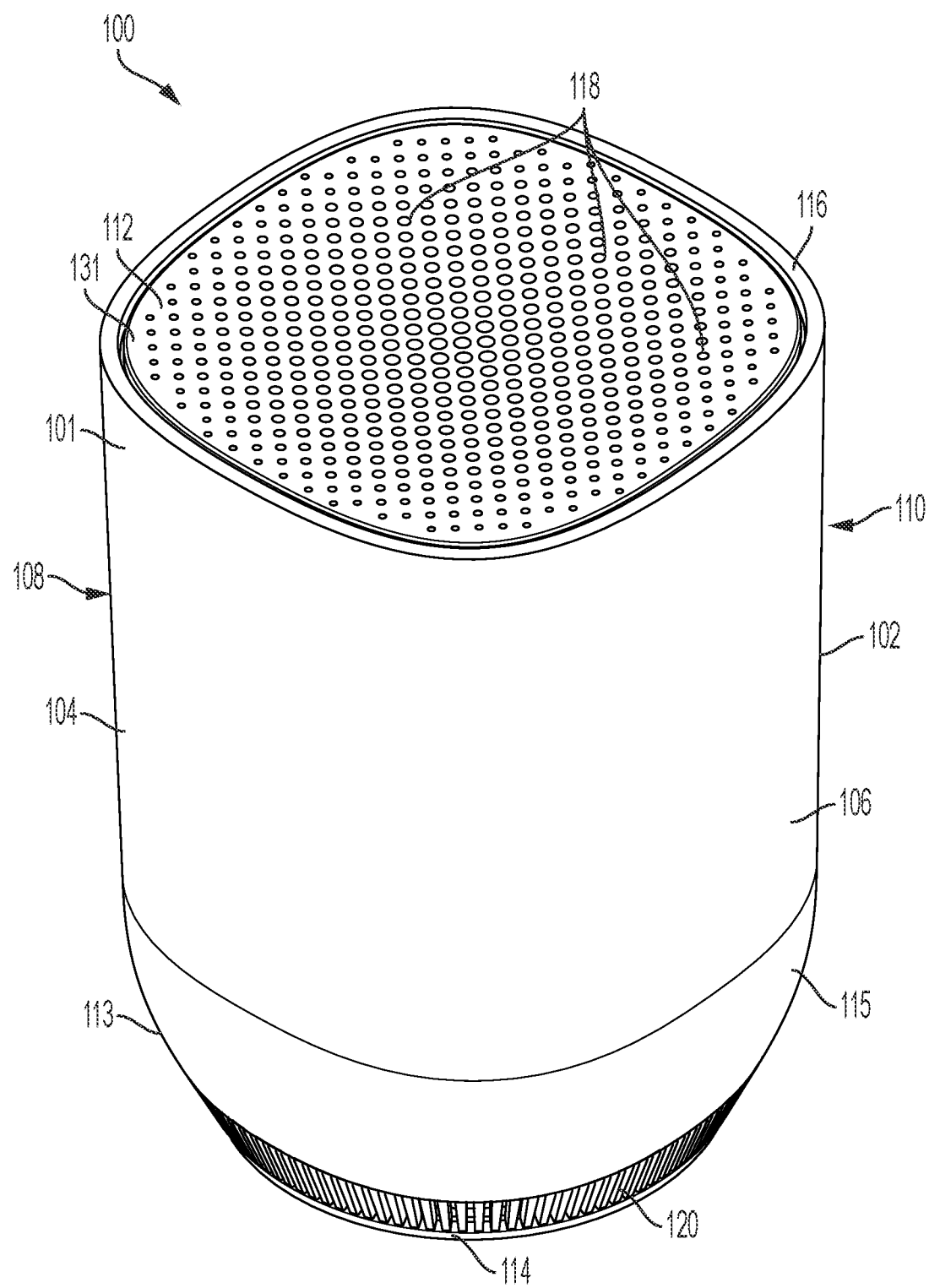
FIG. 1A shows a front perspective view of an example apparatus.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another configuration includes from the one particular value and/or to the other particular value. When values are expressed as approximations, by use of the antecedent "about," it will be understood that the particular value forms another configuration. It will be further understood that the endpoints of each of the ranges are significant both in relation to the other endpoint, and independently of the other endpoint.

"Optional" or "optionally" means that the subsequently described element, feature, event, or circumstance may or may not be included or occur, and that the description includes cases where said element, feature, event, or circumstance is included or occurs and cases where it is not included or does not occur.

Throughout the description and claims of this specification, the word "comprise" and variations of the word, such as "comprising" and "comprises," means "including but not limited to," and is not intended to exclude other components, integers or steps. "Exemplary" means "an example of" and is not intended to convey an indication of a preferred or ideal configuration. "Such as" is not used in a restrictive sense, but for explanatory purposes.

Certain relationships between dimensions of the apparatuses described herein and between features of the apparatuses are described herein using the term "substantially." As used herein, the terms "substantially" indicates that the equal relationship is not a strict relationship and does not exclude functionally similar variations therefrom. Unless context or the description indicates otherwise, the use of the term "substantially" in connection with two or more described dimensions or positions indicates that the equal relationship between the dimensions or positions includes variations that, using mathematical and industrial principles accepted in the art (e.g., rounding, measurement or other systematic errors, manufacturing tolerances, etc.), would not vary the least significant digit of the dimensions. As used herein, the term "substantially vertical" indicates that the vertical relationship of the element is not a strict limitation and does not exclude functionally similar variations therefrom. As used herein, the term "substantially horizontal" indicates that the horizontal relationship of the element is not a strict limitation and does not exclude functionally similar variations therefrom. As used herein, the term "substantially parallel" indicates that the parallel relationship is not a strict relationship and does not exclude functionally similar variations therefrom.

It is understood that when combinations, subsets, interactions, groups, etc. of components and/or apparatuses are described that, while specific reference of each various individual and collective combinations and permutations of these may not be explicitly described, each is specifically contemplated and described herein. This applies to all parts of this application including, but not limited to, steps in the described methods and elements and features in the described apparatuses. Thus, if there are a variety of additional steps that may be performed it is understood that each of these additional steps may be performed with any specific configuration or combination of configurations of the described methods. Furthermore, if there are a variety of additional elements and/or features that may be included or substituted, it is understood that each of these additional elements and/or features may be included or substituted with any specific configuration or combination of configurations of the described systems and apparatuses.

Throughout this application reference is made to block diagrams and flowcharts. It will be understood that each block of the block diagrams and flowcharts, and combinations of blocks in the block diagrams and flowcharts, respectively, may be implemented by processor-executable instructions. These processor-executable instructions may be loaded onto a general purpose computer, special purpose computer, or other programmable data processing apparatus to produce a machine, such that the processor-executable instructions which execute on the computer or other programmable data processing apparatus create a device for implementing the functions specified in the flowchart block or blocks.

Accordingly, blocks of the block diagrams and flowcharts support combinations of devices for performing the specified functions, combinations of steps for performing the specified functions and program instruction means for performing the specified functions. It will also be understood that each block of the block diagrams and flowcharts, and combinations of blocks in the block diagrams and flowcharts, may be implemented by special purpose hardware-based computer systems that perform the specified functions or steps, or combinations of special purpose hardware and computer instructions.

Throughout this application reference is also made to diagrams. It will be understood that each feature or element of the diagrams, and combinations of features or elements in the diagrams, respectively, may be implemented in a number of different ways. Accordingly, the features or elements shown in the diagrams support one or a combinations of devices or apparatuses for performing the specified functions.

FIGS. 1A-1I show various views of an example apparatus 100. The apparatus 100 may comprise a networking device 100. For example, the networking device 100 may comprise one or more of a router, an access point, a hub, a switch, a bridge, a gateway, or a modem. The networking device 100 may take the form of any three-dimensional shape that includes a cavity for housing one or more networking components.

The networking device 100 may comprise a housing 101. The housing 101 may be sized and shaped to receive therein one or more networking components for passing data from one device to another device (e.g., one computing device to another computing device). While the example housing 101 of FIG. 1A is shown as substantially a rectangular prism or squircular prism, this is for example purposes only. In other example embodiments, the housing 101 can have any other three-dimensional shape.

The housing 101 may comprise a base 113. The base 113 may comprises a bottom wall 114. The bottom wall 114 may be configured to contact a support surface, such as a table, floor, wall, or other surface. The bottom wall 114 may be flat or substantially flat. The base 113 may comprise an outer side wall 115. The outer side wall 115 may extend generally vertically upward from the bottom wall 114. The outer side wall 115 may comprise one or more side surfaces depending on the cross-sectional shape of the one or more side walls 102 of the housing 101. The base 113 may comprise one or more venting apertures 120. For example, the base may comprise a plurality of venting apertures 120 extending around all or a portion of a perimeter of the outer side wall 115 adjacent to the bottom wall 114. For example, the plurality of venting apertures may be disposed between the bottom wall 114 and the outer side wall 115 of the base 113. Each venting aperture 120 may comprise a linear opening that provides a fluidic pathway between an exterior of the network device 100 to an interior or cavity 130 of the network device 100. In other examples, each venting aperture 120 may have any other shape.

The housing 101 may comprise one or more side walls 102. The one or more side walls 102 may extend vertically or substantially vertically upward from the base 113 (e.g., from the outer side wall 115 of the base 113). The number of side walls may be based on the cross-sectional shape of the housing 101. For example, a circular cross-section, may comprise a single side wall while a rectangular cross-section may comprise four side walls. Further, manufacturing capabilities may allow for combining two or more side walls into a unitary side wall for device construction purposes.

For example, the one or more side walls 102 may comprise a front side wall 104, a right side wall 106, a left side wall 108, and a rear side wall 110. The identification of side walls as front, left, right, and rear is for example purposes only and is not intended to limit the position or location of any elements described with reference to the one or more side walls 102. For example, the one or more side walls 102 may have a smooth outer surface. In other examples, all or a portion of the one or more side walls may comprise a textured outer surface. One or more (e.g., each) of the front side wall 104, right side wall 106, left side wall 108, and rear side wall 110 may extend from the base 102 to a side wall top end 116. The side wall top end 116 of each of the side walls 104-110 may be collectively referred to as a rim or side wall rim and may be collectively disposed about all or at least a portion of a top wall 112.

For example, each of the one or more side walls 102 (e.g., the side walls 104-110) may be removably coupled to each other of the one or more side walls 102. For example, each of the one or more side walls 102 (e.g., side walls 104-110) may be removably coupled to the base 113. Each of the one or more side walls 102 may be made out of any known material, such as metal or plastic or a combination thereof. Each of the one or more side walls 102 may be planar, curved, or a combination thereof. Each of the one or more side walls 102 may have the same shape as each other one of the one or more side walls 102 or a different shape from one or more of the one or more side walls 102.

The rear side wall 110 may comprise one or more connection components for the network device 100. For example, the rear side wall 110 may comprise a power switch 122. The power switch 122 may selectively turn the network device 100 on and off based on a user depressing or otherwise actuating the power switch 122.

The rear side wall 110 may comprise an input port 126 and an output port 124. For example, each of the input port 126 and the output port 124 may comprise an Ethernet port. Each of the input port 126 and the output port 124 may comprise a cavity for receiving at least a portion of a connector. For example, the connector may be an Ethernet connector coupled to a wire.

The input port 126 may be configured to perform the functionality of terminating an incoming physical link to the network device 100. The input port 126 may be configured to perform a lookup and forwarding function so that a datagram forwarded to a switching fabric 144 is sent to the correct output port. The output port 124 may be configured to store datagrams that have been forwarded to it through the switching fabric 144 and sends the datagrams on an outgoing link.

The rear side wall 110 may comprise a reset switch or button 128. For example, the reset switch 128 may selectively reset the network device 100 based on a user depressing or otherwise actuating the reset switch 128.

The housing 101 may comprise a cavity 130 or interior of the housing 101. For example, the cavity 130 may be defined by the base 113, the one or more side walls 102, and/or the top wall 112. The cavity 130 may define an empty space for receiving one or more components of the network device 100. For example, the cavity 130 may comprise one or more of the power switch 122, the output port 124, the input port 126, one or more processors 142, the switching fabric 144, memory 146, a transmitter, receiver and/or transceiver 148, and an antenna 150.

The one or more processors 142 may be communicably coupled to the switching fabric 144, the memory 146, the power switch 122, the input port 126 and the output port 124, and the transceiver 148. The one or more processors 142 may be configured to execute the commands and process the commands in an operating system of the network device 100, and execute the routing protocols for the network device 100. The one or more processors may be configured to maintain the routing tables and perform network management functions within the network device 100. In the case of multiple processors 142, the network device 100 may utilize parallel computing.

The switching fabric 144 may be communicably coupled to the one or more processors 142, the memory 146, transmitter/receiver/transceiver 148, the input port(s) 126, and the output port(s) 124. The switching fabric 144 may be configured to connect the input port(s) 126 to the output port(s) 124 and may be configured to send datagrams received at one of the input port(s) 126 to one of the output port(s) 124.

The memory 146 may comprise many forms of memory. For example, the memory 146 may comprise read-only memory (ROM), random-access memory (RAM), flash memory, and/or nonvolatile RAM (NVRAM). The ROM may comprise the bootstrap program executed when the network device 100 is turned on. The RAM may comprise the executable file and running file of the configuration file for the network device 100. The flash memory may comprise the operating system for the network device 100. The operating system may be loaded onto RAM from the flash memory when the network device 100 is turned on or reset. The NVRAM may comprise a copy of the running configuration file for the network device 100.

The transmitter, receiver, and/or transceiver 148 may be communicably coupled to the switching fabric 144, the processor 142 and the antenna 150. The transmitter/receiver/transceiver 148 may be configured to receive data and send data. For example, the transmitter/receiver/transceiver 148 may be configured to wirelessly transmit data via any wireless protocol (e.g., Wi-Fi, LAN, WAN, Bluetooth, Bluetooth Low Energy (BLE), Zigbee, etc.). The cavity 130 of the network device 100 may include additional components not described herein. The nature and type of components may be based on the type of network device.

The housing 101 may comprise a top wall 112. The top wall 112 may be coupled (e.g., removably coupled) to one or more of the one or more side walls 102 (e.g., the side walls 104-110). The top wall 112 may comprise a top surface 131 and a bottom surface 132. The top surface 131 may be recessed below the rim defined by the top end 116 of the one or more side walls 102. For example, all or a portion of the top surface 131 may be recessed below the rim 116. For example, the top surface 131 may comprise a concave shape. For example, the top wall 112 (e.g., both the top surface 131 and the bottom surface 132) may comprise a concave shape. For example, the concave shape of the top surface 131 (or top wall 112) may be with respect to the exterior of the housing 101 adjacent the top wall 112.

For example, the portion of the top surface 131 closer to the rim 116 (e.g., the top end 116 of the one or more side walls 102) may have a vertical position that is higher/greater than the portion of the top surface 131 that is farther from the rim. For example, FIGS. 1F and 1G are cross-sectional views of the network device 100 along the section B-B (see FIG. 1C). As best shown in FIG. 1F, the top end of the rim 116 of the one or more side walls 102 may have a vertical distance to the bottom wall 114 (and the support surface when positioned) of Y1. A first portion of the top surface 131*a* of the top wall 112 may have a vertical distance to the bottom wall 114 (and the support surface when positioned) of Y2. A second portion of the top surface 131*b* of the top wall 112 may have a vertical distance to the bottom wall 114 (and the support surface when positioned) of Y3. A third portion of the top surface 131*c* of the top wall 112 may have a vertical distance to the bottom wall 114 (and the support surface when positioned) of Y4. For example, the vertical distance Y1 may be greater than Y2 and Y3. The first portion of the top surface 131*a* may be closer to the rim 116 than the third portion of the top surface 131*c*. The second portion of the top surface 131*b* may be closer to the rim 116 than the third portion of the top surface 131*c*. The vertical distances Y2 and Y3 may be greater than the vertical distance Y4 due to the concave shape of the top surface 131 of the top wall 112.

Figure 1B:
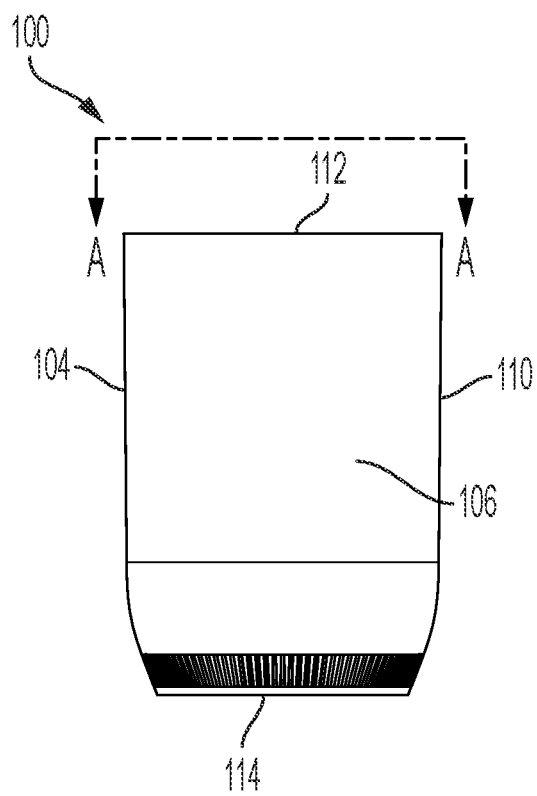
FIG. 1B shows a right-side elevation view of the example apparatus.
Figure 1C:
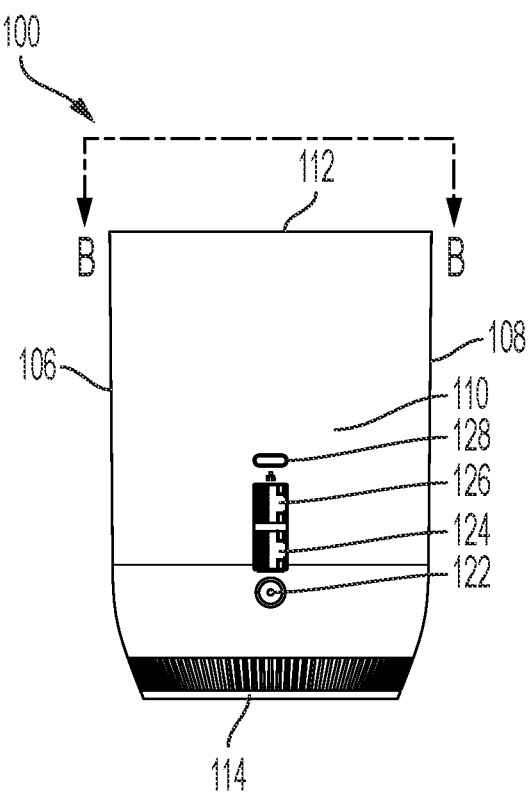
FIG. 1C shows a rear-side elevation view of the example apparatus.
Figure 1D:
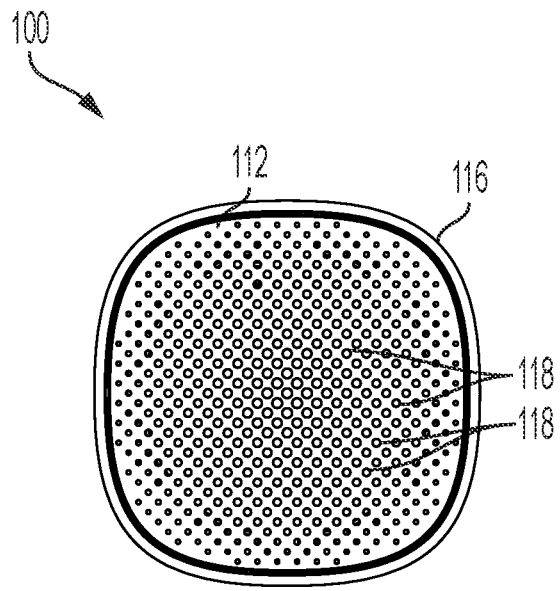
FIG. 1D shows a top plan view of the example apparatus.
Figure 1E:
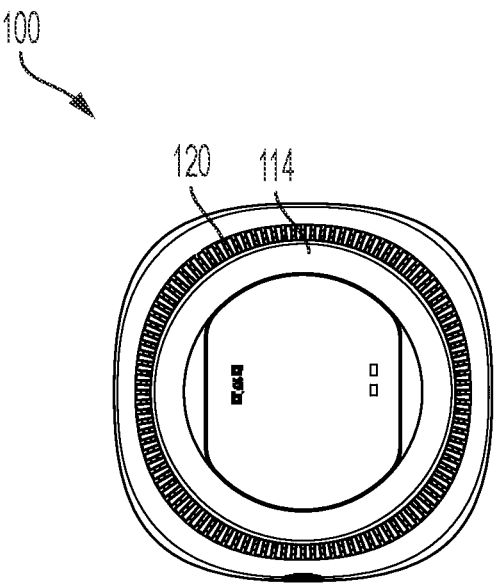
FIG. 1E shows a bottom plan view of the example apparatus.
Figure 1F:
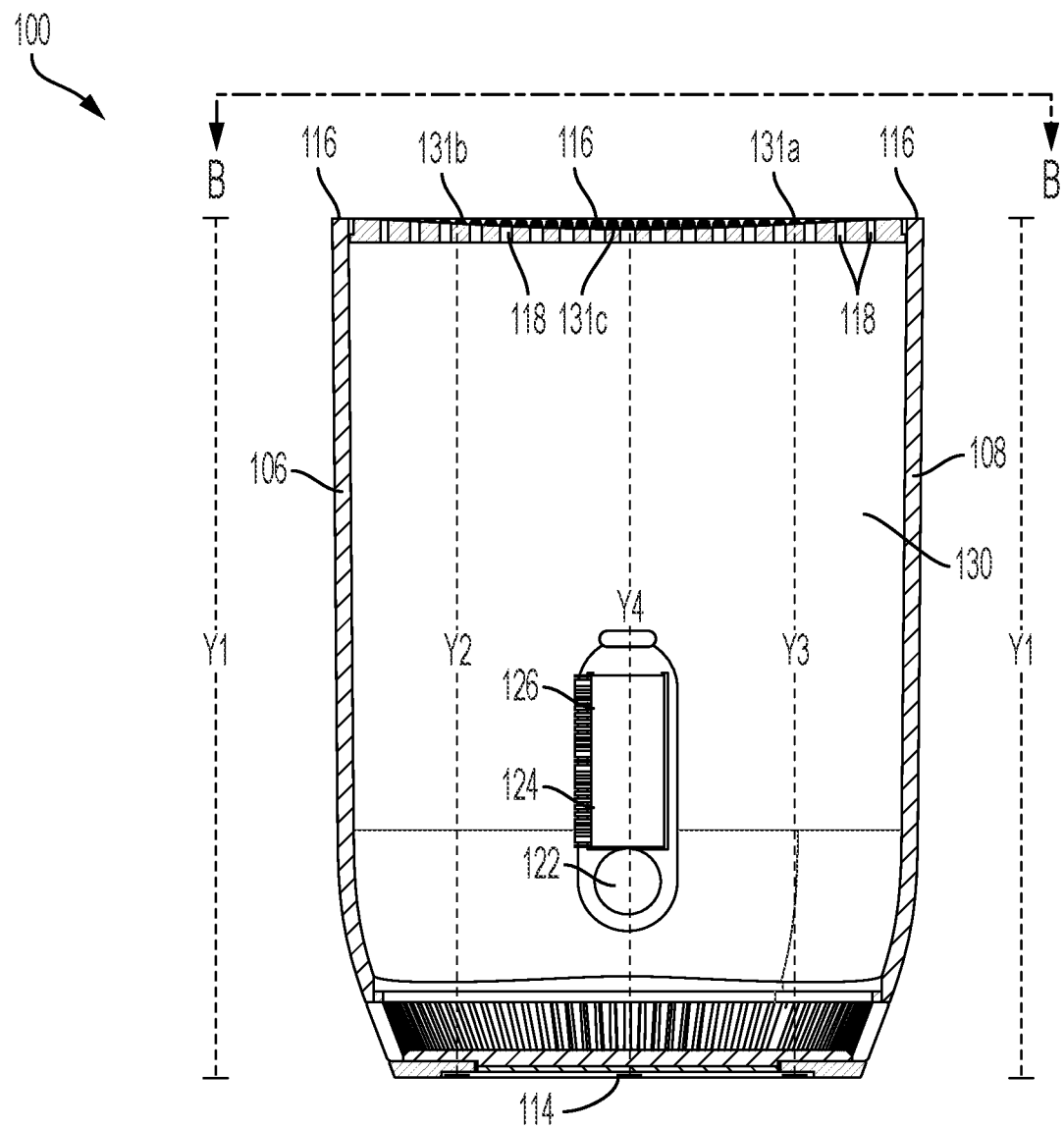
FIGS. 1F and 1G show a full and partial cross-sectional view of the example apparatus along the section B-B.
Figure 1G:
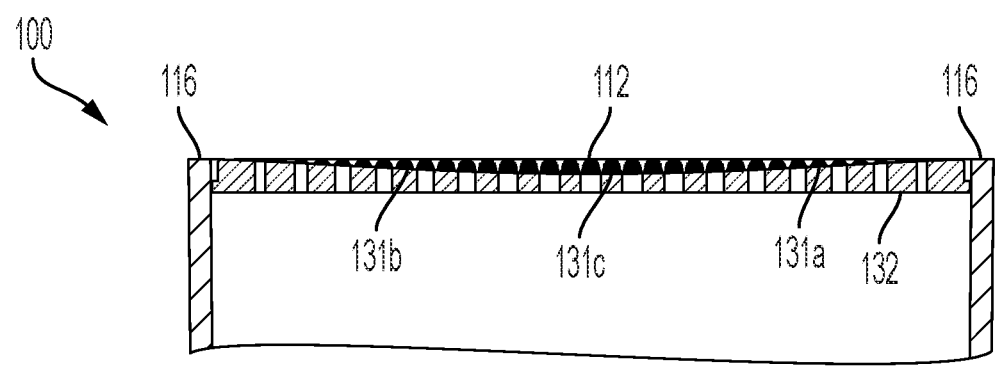
Figure 1H:
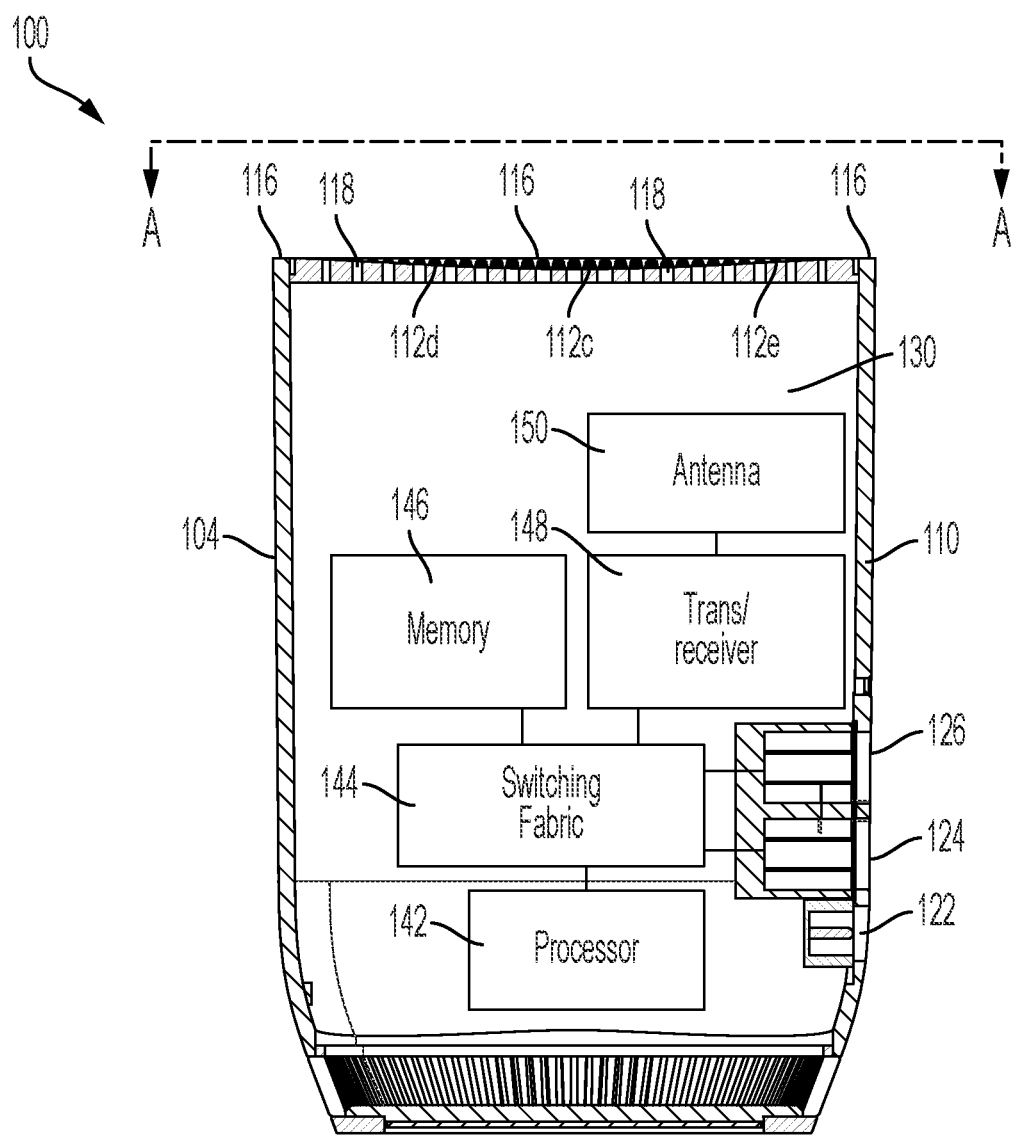
FIGS. 1H and 1I show a full and partial cross-sectional view of the example apparatus along the section A-A.
Figure 1I:
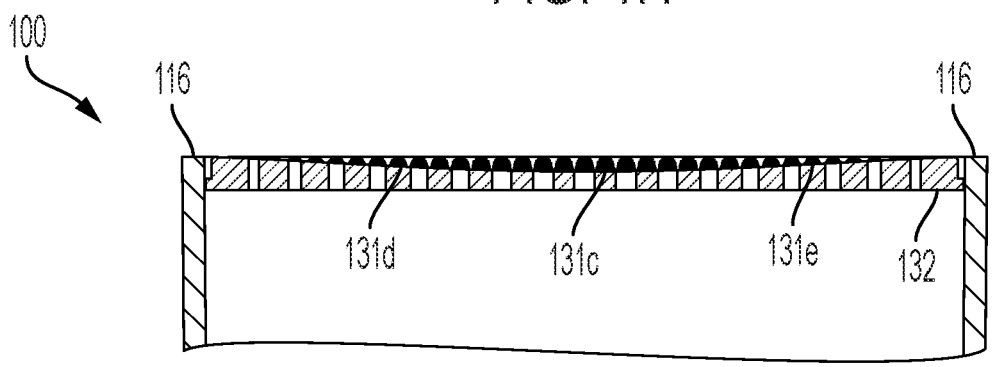

FIGS. 1H and 1I are cross-sectional views of the network device 100 along the section A-A (see FIG. 1B). As best shown in FIG. 1H, the top end of the rim 116 of the one or more side walls 102 may have a first vertical distance to the bottom wall 114 (and the support surface when positioned). A fourth portion of the top surface 131*d* of the top wall 112 may have a second vertical distance to the bottom wall 114 (and the support surface when positioned). A fifth portion of the top surface 131*e* of the top wall 112 may have a third vertical distance to the bottom wall 114 (and the support surface when positioned). A third portion of the top surface 131*c* of the top wall 112 may have the vertical distance to the bottom wall 114 (and the support surface when positioned) of Y4. For example, the first vertical distance may be greater than the second vertical distance and the third vertical distance. The fourth portion of the top surface 131*d* may be closer to the rim 116 than the third portion of the top surface 131c. The fifth portion of the top surface 131e may be closer to the rim 116 than the third portion of the top surface 131c. The second vertical distance and the third vertical distance may be greater than the vertical distance Y4 due to the concave shape of the top surface 131 of the top wall 112.

The top wall 112 may comprise a plurality of apertures 118. For example, the plurality of apertures 118 may extend through the top wall 112 (e.g. from the top surface 131 to the bottom surface 132). For example, the plurality of apertures may extend vertically or substantially vertically through the top wall 112. The plurality of apertures 118 may provide a fluidic pathway from the interior cavity 130 of the housing 101 to the exterior of the housing 101 through the top wall 112 and may be configured to allow heat to pass through the apertures 118 from the interior cavity 130 to the exterior of the housing 101 to protect the components within the housing 101.

For example, the plurality of apertures 118 may be randomly positioned along the top wall 112. For example, the plurality of apertures 118 may be organized in a plurality of rows along the top wall 112. For example, the plurality of apertures 118 may be organized in a plurality of concentric shapes along the top wall 112. For example, the concentric shape may be at least one of a circle, an oval, a square, a rectangle, a rounded square, a rounded rectangle, or a squircle.

For example, the top surface 131 of the top wall 112 may have a concave shape and the bottom surface 132 of the top wall may be flat or planar. In this example, the vertical length of each aperture 118 through the top wall 112 may be greater for the portion of the plurality of apertures 118 that are closer to the rim 116 as compared to the portion of the plurality of apertures 118 that are farther from the rim 116.

In certain examples, the top surface 131 may also comprise a plurality of raised surfaces (not shown). The plurality of raised surfaces may extend up from the concave top surface 131. For example, the plurality of raised surfaces may extend in parallel rows along the top surface 131 of the top wall 112. For example, the plurality of raised surfaces may extend linearly or in a curved or multi-curved manner along the top surface 131. For example, the plurality of raised surfaces may be disposed along the top surface 131 in the shape of at least one of a circle, a square, a rectangle, a rounded square, a rounded rectangle, an oval, or a squircle. For example, the plurality of raised surfaces may be in concentric shapes. For example, the plurality of raised surfaces may be disposed along the top surface 131 in concentric circles, in concentric squares, in concentric rectangles, in concentric rounded squares, in concentric rounded rectangles, in concentric ovals, or in concentric squircles.

For example, the plurality of raised surfaces may comprise a plurality of ridges defining the highest vertical points along or the top edge along the plurality of raised surfaces. For example, all or at least a portion of the top edge along each of the plurality raised surfaces may be at a vertical position below that of the top of the rim 116. For example, all or at least a portion of the top edge along each of the plurality raised surfaces may be at a vertical position below the top end 116 of at least one of the one or more side walls 202.

In these examples, the top surface 131 may also comprise a plurality of recessed surfaces (not shown). The plurality of recessed surfaces may be the concave top surface 131 or extend down into the concave top surface 131. For example, the plurality of recessed surfaces may extend in parallel rows along the top surface 131. For example, the plurality of recessed surfaces may extend linearly, in a curve, or in a multi-curved manner along the top surface 131. For example, the plurality of recessed surfaces may be disposed along the top surface 131 in the shape of at least one of a circle, a square, a rectangle, a rounded square, a rounded rectangle, an oval, or a squircle. For example, the plurality of recessed surfaces may be concentric shapes. For example, the plurality of recessed surfaces may be disposed along the top surface 131 in concentric circles, in concentric squares, in concentric rectangles, in concentric rounded squares, in concentric rounded rectangles, in concentric ovals, or in concentric squircles.

For example, each of the plurality of raised surfaces may be positioned between two of the plurality of recessed surfaces discussed above. For example, the top surface 131 may comprise alternating raised surfaces and recessed surfaces. For example, the alternating raised surfaces and recessed surfaces may be concentric with one another in any of the shapes described above.

For example, all or at least a portion of the top edge along each of the plurality raised surfaces may be at a vertical position below that of the vertical position of the top of the rim. For example, all or at least a portion of the top edge along each of the plurality raised surfaces may be at a vertical position below the top end 116 of at least one of the one or more side walls 102.

For example, the top surface 131 may comprise an angular surface (not shown but substantially the same as that shown and described with reference to FIGS. 2A-2D) extending from one of the recessed surfaces to one of the raised surfaces and for each of adjacent recessed surface/raised surface pair. For example, the angular surface may extend vertically at an angle of anywhere between 1-60 degrees from the horizontal. For example, the top surface 131 may comprise a second angular surface (not shown but substantially the same as that shown and described with reference to FIGS. 2A-2D) extending from the raised surface to the next adjacent recessed surface and for each of adjacent raised surface/recessed surface pair. For example, the second angular surface may extend vertically at an angle of anywhere between 1-60 degrees from the horizontal.

For example, the raised surfaces closer to the rim 116 (e.g., the top end 116 of the one or more side walls 102) may have a vertical position that is higher/greater than the raised surfaces that are farther from the rim 116. For example, the recessed surfaces closer to the rim 116 (e.g., the top end 116 of the one or more side walls 102) may have a vertical position that is higher/greater than the recessed surfaces that are farther from the rim 116.

For example, the top end of the rim 116 of the one or more side walls 102 may have a first vertical distance to the bottom wall 114 (and the support surface when positioned). A first recessed surface of the top wall 112 may have a second vertical distance to the bottom wall 114 (and the support surface when positioned). A second recessed surface of the top wall 212 may have a third vertical distance to the bottom wall 114 (and the support surface when positioned). A third recessed surface of the top wall 112 may have a fourth vertical distance to the bottom wall 114 (and the support surface when positioned). A fourth recessed surface of the top wall 112 may have a fifth vertical distance to the bottom wall 114 (and the support surface when positioned). For example, the first vertical distance may be greater than the second vertical distance. The first recessed surface may be closer to the rim 116 than the second recessed surface, and, as such, the second vertical distance may be greater than the third vertical distance. The second recessed surface may be closer to the rim 116 than the third recessed surface, and, as such, the third vertical distance may be greater than the fourth vertical distance. The third recessed surface may be closer to the rim 116 than the fourth recessed surface, and, as such, the fourth vertical distance may be greater than the fifth vertical distance.

For example, the top end of the rim 116 of the one or more side walls 102 may have a first vertical distance to the bottom wall 114 (and the support surface when positioned). A first raised surface of the top wall 112 may have a second vertical distance to the bottom wall 114 (and the support surface when positioned). A second raised surface of the top wall 112 may have a third vertical distance to the bottom wall 114 (and the support surface when positioned). A third raised surface of the top wall 212 may have a fourth vertical distance to the bottom wall 114 (and the support surface when positioned). For example, the first vertical distance may be greater than the second vertical distance. The first raised surface may be closer to the rim 116 than the second raised surface, and, as such, the second vertical distance may be greater than the third vertical distance. The second raised surface may be closer to the rim 116 than the third raised surface, and, as such, the third vertical distance may be greater than the fourth vertical distance.

In these examples, the top wall 112 may also comprise a plurality of apertures 118. For example, the plurality of apertures 118 may extend through the top wall 112 (e.g. from the top surface 131 to the bottom surface 132). For example, the plurality of apertures 118 may be randomly positioned along the top wall 112. For example, the plurality of apertures 118 may be organized in a plurality of rows along the top wall 212. For example, at least a portion of the apertures 118 may be disposed in one or more of the recessed surfaces. For example, at least a portion of the apertures 118 may be disposed on one or more of the angular surfaces and below the level of the adjacent corresponding ridge or top of the raised surface.

In certain examples, the top surface 131 may comprise a plurality of raised surfaces (not shown but substantially the same as that shown and described with reference to FIGS. 3A-3D). The plurality of raised surfaces may extend up from the concave top surface 131. For example, the plurality of raised surfaces may extend in parallel rows along the top surface 131 of the top wall 112. For example, the plurality of raised surfaces may extend linearly, in a curve, or in a multi-curve manner along the top surface 131. For example, the plurality of raised surfaces may comprise a plurality of ridges defining the highest vertical points along or the top edge along the plurality of raised surfaces. For example, all or at least a portion of the top edge along each of the plurality raised surfaces may be at a vertical position below that of the top of the rim 116. For example, all or at least a portion of the top edge along each of the plurality raised surfaces may be at a vertical position below the top end 116 of at least one of the one or more side walls 102.

The top surface 131 may comprise a plurality of recessed surfaces (not shown but substantially the same as that shown and described with reference to FIGS. 3A-3D). The plurality of recessed surfaces may be the concave top surface 131 or extend down into the concave top surface 131. For example, the plurality of recessed surfaces may extend in parallel rows along the top surface 131. For example, the plurality of recessed surfaces may extend linearly, in a curve, or in a multi-curved manner along the top surface 131. For example, one or more or each of the plurality of raised surfaces may be positioned between two of the plurality of recessed surfaces. For example, the top surface 131 may comprise alternating raised surfaces and recessed surfaces. For example, the alternating raised surfaces and recessed surfaces may comprise a waveform or wave shape with a corresponding plurality of peaks and a plurality of troughs.

For example, all or at least a portion of the peak along each of the plurality raised surfaces may be at a vertical position below that of the vertical position of the top of the rim 116. For example, all or at least a portion of the corresponding peaks along each of the plurality raised surfaces may be at a vertical position below the top end 116 of at least one of the one or more side walls 102.

For example, the peaks of the raised surfaces closer to the rim 116 (e.g., the top end 116 of the one or more side walls 102) may have a vertical position that is higher/greater than the peaks of the raised surfaces that are farther from the rim 116. For example, the troughs of the recessed surfaces that are closer to the rim 116 (e.g., the top end 116 of the one or more side walls 102) may have a vertical position that is higher/greater than the troughs of the recessed surfaces that are farther from the rim 116.

For example, the top end of the rim 116 may have a first vertical distance to the bottom wall 114 (and the support surface when positioned). A first recessed surface or trough of the top wall 112 may have a second vertical distance to the bottom wall 114 (and the support surface when positioned). A second recessed surface or trough of the top wall 112 may have a third vertical distance to the bottom wall 114 (and the support surface when positioned). A third recessed surface or trough of the top wall 112 may have a fourth vertical distance to the bottom wall 114 (and the support surface when positioned). For example, the first vertical distance may be greater than the second vertical distance. The first recessed surface or trough may be closer to the rim 116 than the second recessed surface or trough, and, as such, the second vertical distance may be greater than the third vertical distance. The second recessed surface or trough may be closer to the rim 116 than the third recessed surface or trough, and, as such, the third vertical distance may be greater than the fourth vertical distance.

For example, the top end of the rim 116 of the one or more side walls 102 may have a first vertical distance to the bottom wall 114 (and the support surface when positioned). A first raised surface or peak of the top wall 112 may have a second vertical distance to the bottom wall 114 (and the support surface when positioned). A second raised surface or peak of the top wall 112 may have a third vertical distance to the bottom wall 114 (and the support surface when positioned). A third raised surface or peak of the top wall 112 may have a fourth vertical distance to the bottom wall 114 (and the support surface when positioned). For example, the first vertical distance may be greater than the second vertical distance. The first raised surface or peak may be closer to the rim 116 than the second raised surface or peak, and, as such, the second vertical distance may be greater than the third vertical distance. The second raised surface or peak may be closer to the rim 116 than the third raised surface or peak, and, as such, the third vertical distance may be greater than the fourth vertical distance.

In these examples, the top wall 112 may comprise a plurality of apertures 118. For example, the plurality of apertures 118 may extend through the top wall 112 (e.g. from the top surface 131 to the bottom surface 132). For example, at least a portion of the apertures 118 may be disposed in or along one or more of the recessed surfaces or troughs. For example, one or a plurality of at least the portion of the apertures 118 may be disposed in or along each of the recessed surfaces or troughs. For example, at least a portion of the apertures 118 may be disposed in or along one or more of the raised surfaces or peaks. For example, one or a plurality of at least the portion of the apertures 118 may be disposed in or along each of the raised surfaces or peaks.

The configuration of the top wall 112 in combination with the rim 116 and/or top end of the one or more side walls 102 provide a capability for the fluidic pathway from the interior of cavity 130 of the device 100 to an exterior of the device 100, via the apertures 118, to remain unblocked even when an object is placed along the rim 116 or top end of the one or more side walls 102 in such a manner that the object is positioned directly vertically above or all or at least a portion of the apertures 118. The space created between the bottom side of the object and the top surface 131 of the top wall 112 allows air to continue to flow through the apertures 118 from the interior cavity 130 of the device 100 and allows the device 100 to cool the interior components. The air may then move within the space created between the bottom side of the object and the top surface 131 of the top wall 112 to an area not covered by the object and move away from the device, as shown in FIG. 4B.

For example, when the object is placed along the rim 116 and covers at least a portion of the top wall 112, the bottom side of the object may contact the top edge of the rim 116 or top edge of the one or more side walls 102. Due to the vertical spacing caused by one or more of the top wall 112 being recessed and/or having a concave shape with respect to the rim 116 and the top end of the one or more side walls 102, air is not blocked and may continue to flow through the portion of the plurality of apertures 118 extending through the portion of the top wall 112 directly below/under the object. The air may then move along the area between the top surface 131 of the top wall 112 and the bottom side of the object to a portion of the top wall 112 that is not directly vertically below/under by the object and away from the top wall 112 of the device 100. As such, even the portion of the apertures 118 positioned directly vertically under/beneath the object may still continue to function as a fluidic path for removing heated air from the interior cavity 130 of the device 100 and may prevent or reduce the possibility of the device 100 overheating or suffering heat related damage due to a user placing the object on top of the device 100.

For examples where the object has a bottom side that is a non-flat surface or that is flexible or pliant and that may include at least a portion that extends down below the rim 116 and/or top end of the one or more side walls 102, at least a portion of the apertures 118 directly under/beneath the object may still continue to function as a fluidic path for removing air from the interior cavity 130 due to one or more of the top surface 131 of the top wall 112 being both recessed below the rim 116 and/or top end of the one or more side walls 102 and having a concave shape.

In addition, for objects having a very pliant or flexible bottom side (e.g., paper, tissue, etc.), additional features may be provided for allowing at least a portion of the apertures 118 directly below/under the object to continue to function as a fluidic path. For example, the top surface 131 of the top wall 112 may include a plurality raised surfaces and a plurality of recessed surfaces. Apertures 118 may be positioned within the plurality of recessed surfaces and/or along the transitions from the plurality of raised surfaces to the plurality of recessed surfaces along the top surface 131 of the top wall 112. For example, the flexible or pliant part of the bottom side of the object may contact the multiple raised surfaces of the top surface 131 of the top wall 112 and may be supported thereby. The support provided by the one or more raised surfaces may prevent the object from further obstructing the apertures 118 positioned in the recessed surfaces and the transitions between the raised surface and the recessed surface of the top surface 131. While the object is placed on the device 100, the apertures 118 in the recessed surfaces and/or in the transitions portions of the top surface 131 may not be blocked and, as such, air flowing through those apertures 118, under the object, is not blocked and may continue to flow through that portion of the plurality of apertures 118 extending through the portion of the top wall 112 directly vertically below/under the object. The air may then move along the channel defined by the space between two adjacent raised surfaces and along the area between the top surface 131 of the top wall 112 and the bottom side of the object to a portion of the top wall 112 that is not directly vertically below/under the object and away from the top wall 112 of the device 100. As such, even at least a portion of the apertures 118 positioned directly vertically under/below the object (e.g., those apertures 118 along the recessed surfaces and/or along the transition between the recessed surface and the raised surface along the top surface 131) may still continue to function as a fluidic path for removing heated air from the interior cavity 130 of the device 100 and may prevent or reduce the likelihood of the device 100 overheating or suffering heat related damage due to a user placing the object on top of the device 100.

FIGS. 2A-2D show various views of an example apparatus 200. The apparatus 200 may comprise a networking device 200. For example, the networking device 200 may comprise one or more of a router, an access point, a hub, a switch, a bridge, a gateway, or a modem. The networking device 200 may take the form of any three-dimensional shape that includes a cavity for housing one or more networking components.

Figure 2A:
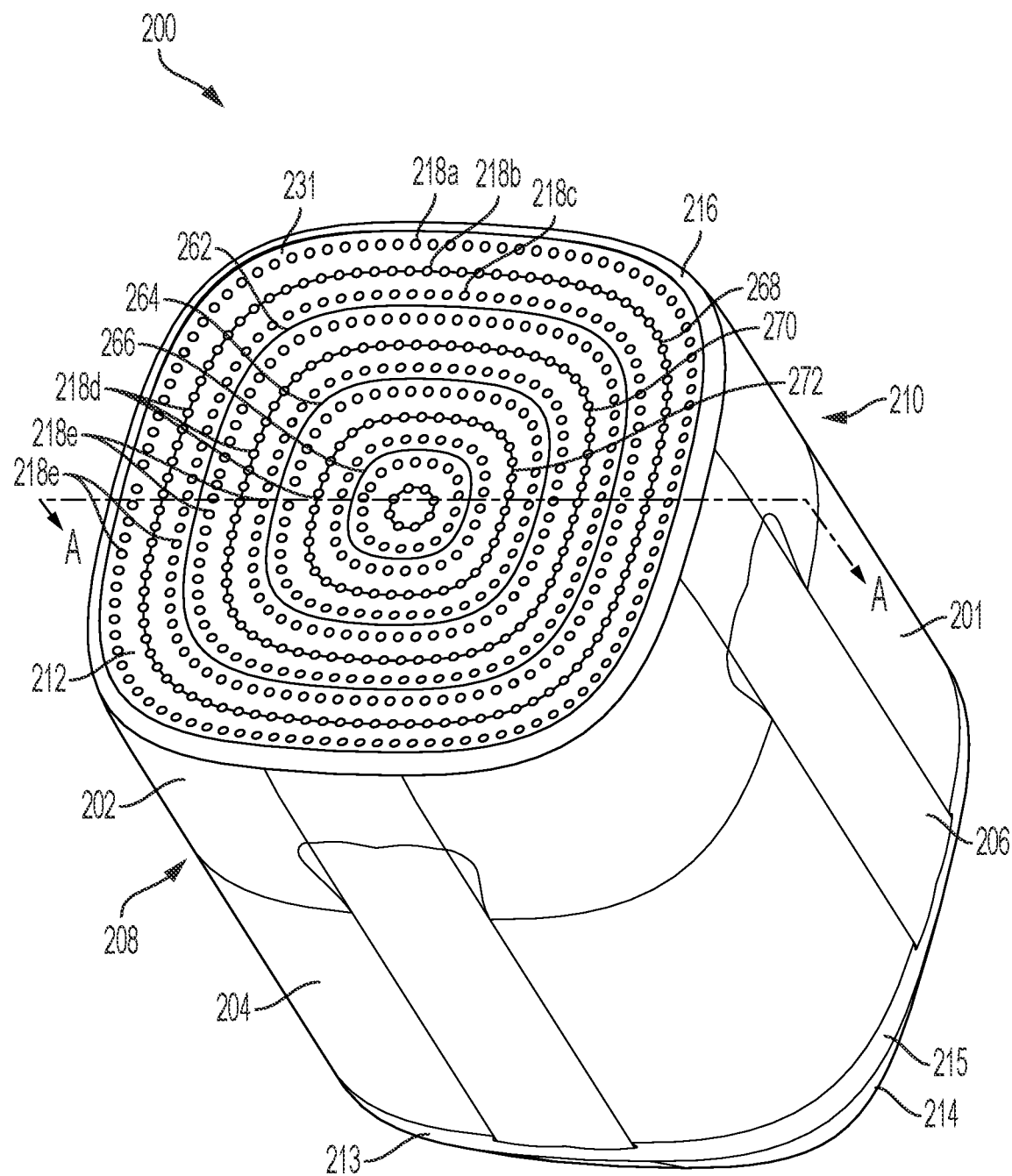
FIG. 2A shows a front perspective view of an example apparatus.
Figure 2B:
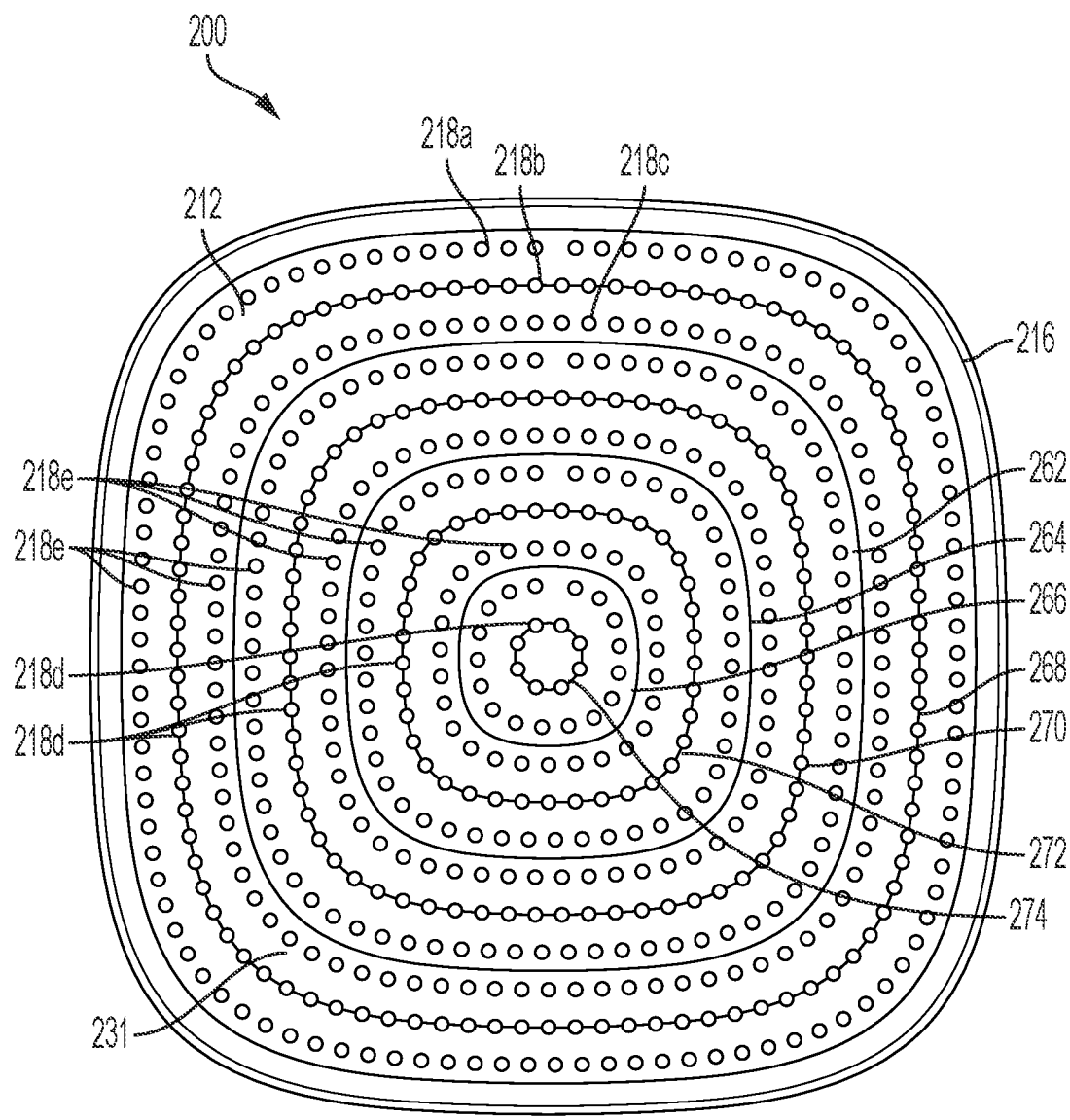
FIG. 2B shows a top plan view of the example apparatus.

The networking device 200 may comprise a housing 201. The housing 201 may be sized and shaped to receive therein one or more networking components for passing data from one device to another device (e.g., one computing device to another computing device). While the example housing 201 of FIG. 2A is shown as substantially a rectangular prism or squircular prism, this is for example purposes only. In other example embodiments, the housing 201 can have any other three-dimensional shape.

The housing 201 may comprise a base 213. The base 213 may comprises a bottom wall 214. The bottom wall 214 may be configured to contact a support surface, such as a table, floor, wall, or other surface. The bottom wall 214 may be flat or substantially flat. The base 213 may comprise an outer side wall 215. The outer side wall 215 may extend generally vertically upward from the bottom wall 214. The outer side wall 215 may comprise one or more side surfaces depending on the cross-sectional shape of the one or more side walls 202 of the housing 201. The base 213 may comprise one or more venting apertures (not shown but the same or substantially the same as that of 120 of FIG. 1A). For example, the base 213 may comprise a plurality of venting apertures extending around all or a portion of a perimeter of the outer side wall 215 adjacent to the bottom wall 214. For example, the plurality of venting apertures may be disposed between the bottom wall 214 and the outer side wall 215 of the base 213. Each venting aperture may comprise a linear opening that provides a fluidic pathway between an exterior of the network device 200 to an interior or cavity 230 of the network device 200. In other examples, each venting aperture may have any other shape.

The housing 201 may comprise one or more side walls 202. The one or more side walls 202 may extend vertically or substantially vertically upward from the base 213 (e.g., from the outer side wall 215 of the base 213). The number of side walls may be based on the cross-sectional shape of the housing 201. For example, a circular cross-section, may comprise a single side wall while a rectangular cross-section may comprise four side walls. Further, manufacturing capabilities may allow for combining two or more side walls into a unitary side wall for device construction purposes.

For example, the one or more side walls 202 may comprise a front side wall 204, a right side wall 206, a left side wall 208, and a rear side wall 210. The identification of side walls as front, left, right, and rear is for example purposes only and is not intended to limit the position or location of any elements described with reference to the one or more side walls 202. For example, the one or more side walls 202 may have a smooth outer surface. In other examples, all or a portion of the one or more side walls 202 may comprise a textured outer surface (e.g., ribbed, rough, a plurality of raised bumps, etc.). One or more (e.g., each) of the front side wall 204, right side wall 206, left side wall 208, and rear side wall 210 may extend from the base 202 to a side wall top end 216. The side wall top end 216 of each of the side walls 204-210 may be collectively referred to as a rim or side wall rim 116 and may be collectively disposed about all or at least a portion of a top wall 212.

For example, each of the one or more side walls 202 (e.g., the side walls 204-210) may be removably coupled to each other of the one or more side walls 202. For example, each of the one or more side walls 202 (e.g., side walls 204-210) may be removably coupled to the base 213. Each of the one or more side walls 202 may be made out of any known material, such as metal or plastic or a combination thereof. Each of the one or more side walls 202 may be planar, curved, or a combination thereof. Each of the one or more side walls 202 may have the same shape as each other one of the one or more side walls 202 or a different shape from one or more of the one or more side walls 202.

The rear side wall 210 may comprise one or more connection components for the network device 200. For example, the rear side wall 210 may comprise a power switch (not shown but the same or substantially similar to that of 122 of FIG. 1C). The power switch may selectively turn the network device 200 on and off based on a user depressing or otherwise actuating the power switch.

The rear side wall 210 may comprise an input port (not shown but the same or substantially similar to that of 126 of FIG. 1C) and an output port (not shown but the same or substantially similar to that of 124 of FIG. 1C). For example, each of the input port and the output port may comprise an Ethernet port. Each of the input port and the output port may comprise a cavity for receiving at least a portion of a connector. For example, the connector may be an Ethernet connector coupled to a wire.

The input port may be configured to perform the functionality of terminating an incoming physical link to the network device 200. The input port may be configured to perform a lookup and forwarding function so that a datagram forwarded to a switching fabric (not shown but the same or substantially similar to that of 144 of FIG. 1H) is sent to the correct output port. The output port may be configured to store datagrams that have been forwarded to it through the switching fabric and sends the datagrams on an outgoing link.

The rear side wall 210 may comprise a reset switch or button (not shown but the same or substantially similar to that of 128 of FIG. 1C). For example, the reset switch may selectively reset the network device 200 based on a user depressing or otherwise actuating the reset switch.

The housing 201 may comprise a cavity 230 or interior of the housing 201. For example, the cavity 230 may be defined by the base 213, the one or more side walls 202, and/or the top wall 212. The cavity 230 may define an empty space for receiving one or more components of the network device 200. For example, the cavity 230 may comprise one or more of the power switch, the output port, the input port, one or more processors (not shown but the same or substantially similar to that of 142 of FIG. 1H), the switching fabric (not shown but the same or substantially similar to that of 144 of FIG. 1H), memory (not shown but the same or substantially similar to that of 146 of FIG. 1H), a transmitter, receiver and/or transceiver (not shown but the same or substantially similar to that of 148 of FIG. 1H), and an antenna (not shown but the same or substantially similar to that of 150 of FIG. 1H).

The one or more processors may be communicably coupled to the switching fabric, the memory, the power switch, the input port, the output port, and the transceiver. The one or more processors may be configured to execute the commands and process the commands in an operating system of the network device 200, and execute the routing protocols for the network device 200. The one or more processors may be configured to maintain the routing tables and perform network management functions within the network device 200. In the case of multiple processors, the network device 200 may utilize parallel computing.

The switching fabric may be communicably coupled to the one or more processors, the memory, the transmitter/receiver/transceiver, the input port(s), and the output port(s). The switching fabric may be configured to connect the input port(s) to the output port(s) and may be configured to send datagrams received at one of the input port(s) to one of the output port(s).

The memory may comprise many forms of memory. For example, the memory may comprise read-only memory (ROM), random-access memory (RAM), flash memory, and/or nonvolatile RAM (NVRAM). The ROM may comprise the bootstrap program executed when the network device 200 is turned on. The RAM may comprise the executable file and running file of the configuration file for the network device 200. The flash memory may comprise the operating system for the network device 200. The operating system may be loaded onto RAM from the flash memory when the network device 200 is turned on or reset. The NVRAM may comprise a copy of the running configuration file for the network device 200.

The transmitter, receiver, and/or transceiver may be communicably coupled to the switching fabric, the processor and the antenna. The transmitter/receiver/transceiver may be configured to receive data and send data. For example, the transmitter/receiver/transceiver may be configured to wirelessly transmit data via any wireless protocol (e.g., Wi-Fi, LAN, WAN, Bluetooth, Bluetooth Low Energy (BLE), Zigbee, etc.). The cavity 230 of the network device 200 may include additional components not described herein. The nature and type of components may be based on the type of network device.

The housing 201 may comprise a top wall 212. The top wall 212 may be coupled (e.g., removably coupled) to one or more of the one or more side walls 202 (e.g., the side walls 204-210). The top wall 212 may comprise a top surface 231 and a bottom surface 232. The top surface 231 may be recessed below the rim defined by the top end 216 of the one or more side walls 202. For example, all or a portion of the top surface 231 may be recessed below the rim 216. For example, the top surface 231 may comprise a concave shape. For example, the top wall 212 (e.g., both the top surface 231 and the bottom surface 232) may comprise a concave shape. For example, the concave shape of the top surface 231 (or top wall 212) may be with respect to the exterior of the housing 201 adjacent the top wall 212.

The top surface 231 may comprise a plurality of raised surfaces 262, 264, 266. The plurality of raised surfaces 262-264 may extend up from the concave top surface 231. For example, the plurality of raised surfaces 262-266 may extend in parallel rows along the top surface 231 of the top wall 212. For example, the plurality of raised surfaces 262-266 may extend linearly along the top surface 231 of the top wall 212.

For example, the plurality of raised surfaces 262-266 may be disposed along the top surface 231 of the top wall 212 in the shape of at least one of a circle, a square, a rectangle, a rounded square, a rounded rectangle, an oval, or a squircle. For example, the plurality of raised surfaces 262-266 may be concentric. For example, the plurality of raised surfaces 262-266 may be disposed along the top surface 231 of the top wall 212 in concentric circles, in concentric squares, in concentric rectangles, in concentric rounded squares, in concentric rounded rectangles, in concentric ovals, or in concentric squircles.

For example, the plurality of raised surfaces 262-266 may comprise a plurality of ridges defining the highest vertical points along or the top edge along the plurality of raised surfaces 262-266. For example, all or at least a portion of the top edge along each of the plurality raised surfaces may be at a vertical position below that of the top of the rim 216. For example, all or at least a portion of the top edge along each of the plurality raised surfaces may be at a vertical position below the top end 216 of at least one of the one or more side walls 202.

The top surface 231 may comprise a plurality of recessed surfaces 268, 270, 272, 274. The plurality of recessed surfaces 268-274 may be the concave top surface 231 or extend down into the concave top surface 231. For example, the plurality of recessed surfaces 268-274 may extend in parallel rows along the top surface 231 of the top wall 212. For example, the plurality of recessed surfaces 268-274 may extend linearly along the top surface 231 of the top wall 212.

For example, the plurality of recessed surfaces 268-274 may be disposed along the top surface 231 of the top wall 212 in the shape of at least one of a circle, a square, a rectangle, a rounded square, a rounded rectangle, an oval, or a squircle. For example, the plurality of recessed surfaces 268-274 may be concentric. For example, the plurality of recessed surfaces 268-274 may be disposed along the top surface 231 of the top wall 212 in concentric circles, in concentric squares, in concentric rectangles, in concentric rounded squares, in concentric rounded rectangles, in concentric ovals, or in concentric squircles.

For example, each of the plurality of raised surfaces 262-266 may be positioned between two of the plurality of recessed surfaces 268-274. For example, the top surface 231 may comprise alternating raised surfaces 262-266 and recessed surfaces 268-274. For example, the alternating raised surfaces 262-266 and recessed surfaces 268-274 may be concentric with one another in any of the shapes described above.

For example, all or at least a portion of the top edge along each of the plurality raised surfaces 262-266 may be at a vertical position below that of the vertical position of the top of the rim 216. For example, all or at least a portion of the top edge along each of the plurality raised surfaces 262-266 may be at a vertical position below the top end 216 of at least one of the one or more side walls 202.

For example, the top surface 231 may comprise an angular surface 280 extending from the recessed surface 274 to the raised surface 266. For example, the angular surface 280 may extend vertically at an angle of anywhere between 1-60 degrees from the horizontal. For example, the top surface 231 may comprise an angular surface 282 extending from the raised surface 266 to the recessed surface 272. For example, the angular surface 282 may extend vertically at an angle of anywhere between 1-60 degrees from the horizontal.

For example, the top surface 231 may comprise an angular surface 284 extending from the recessed surface 272 to the raised surface 264. For example, the angular surface 284 may extend vertically at an angle of anywhere between 1-60 degrees from the horizontal. For example, the top surface 231 may comprise an angular surface 286 extending from the raised surface 264 to the recessed surface 270. For example, the angular surface 286 may extend vertically at an angle of anywhere between 1-60 degrees from the horizontal.

For example, the top surface 231 may comprise an angular surface 288 extending from the recessed surface 270 to the raised surface 262. For example, the angular surface 288 may extend vertically at an angle of anywhere between 1-60 degrees from the horizontal. For example, the top surface 231 may comprise an angular surface 290 extending from the raised surface 262 to the recessed surface 268. For example, the angular surface 290 may extend vertically at an angle of anywhere between 1-60 degrees from the horizontal. For example, the top surface 231 may comprise an angular surface 292 extending from the recessed surface 268 towards the rim 216 or top end 216 of the at least one side wall 202. For example, the angular surface 292 may extend vertically at an angle of anywhere between 1-60 degrees from the horizontal. The number of raised surfaces 262-266 and recessed surfaces 268-274 shown and described is for example only as greater or fewer raised surfaces 262-266 and recessed surfaces 268-274 may be provided in other example embodiments.

For example, the raised surfaces 262-266 closer to the rim 216 (e.g., the top end 216 of the one or more side walls 202) may have a vertical position that is higher/greater than the raised surfaces 262-266 that are farther from the rim 216. For example, the recessed surfaces 268-274 closer to the rim 216 (e.g., the top end 216 of the one or more side walls 202) may have a vertical position that is higher/greater than the recessed surfaces 268-274 that are farther from the rim 216.

Figure 2C:
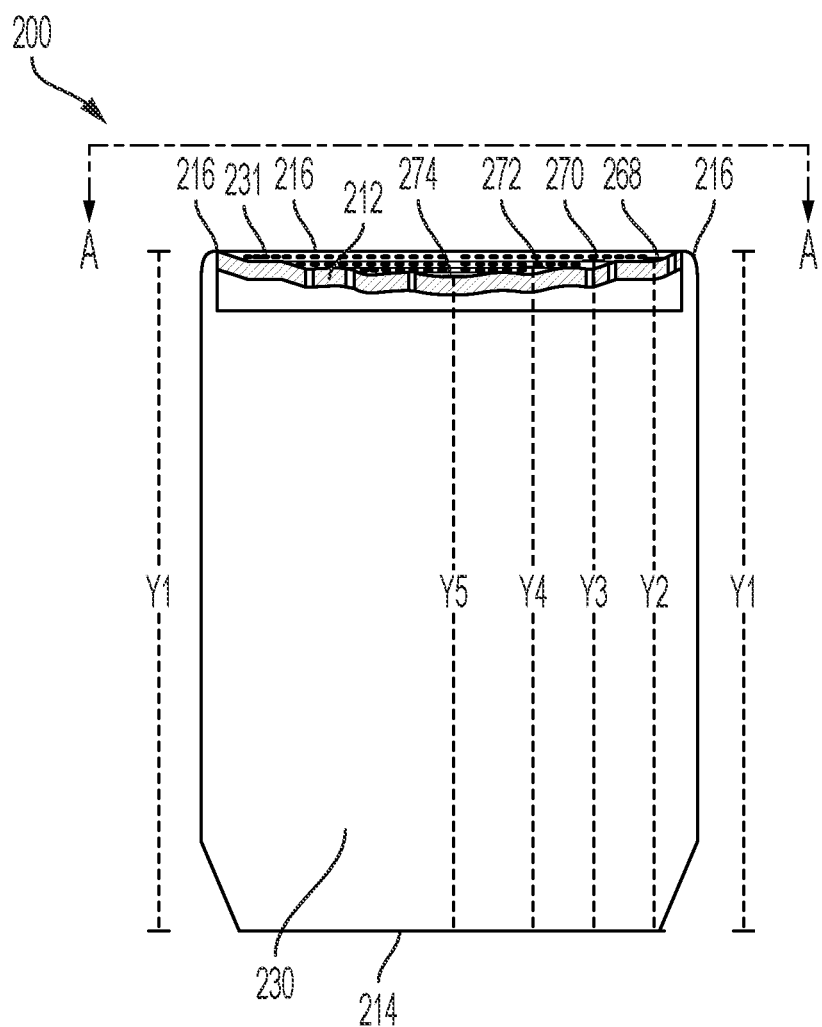
FIGS. 2C and 2D show a full and partial cross-sectional view of the example apparatus along the section A-A.
Figure 2D:
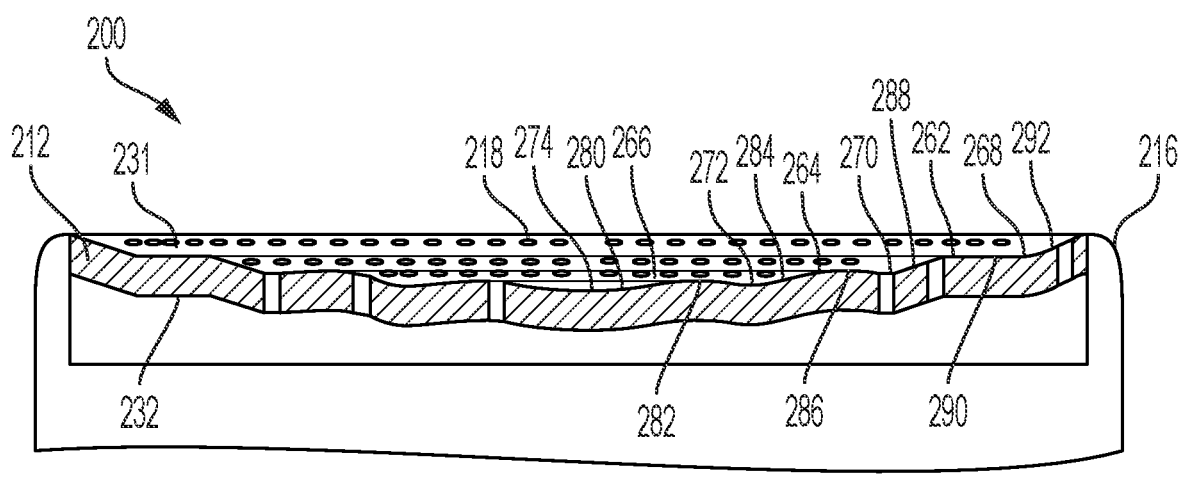

For example, FIGS. 2C and 2D are cross-sectional views of the network device 200 along the section A-A (see FIG. 2A). As best shown in FIG. 2C, the top end of the rim 216 of the one or more side walls 202 may have a vertical distance to the bottom wall 214 (and the support surface when positioned) of Y1. A first recessed surface 268 of the top wall 212 may have a vertical distance to the bottom wall 214 (and the support surface when positioned) of Y2. A second recessed surface 270 of the top wall 212 may have a vertical distance to the bottom wall 214 (and the support surface when positioned) of Y3. A third recessed surface 272 of the top wall 212 may have a vertical distance to the bottom wall 214 (and the support surface when positioned) of Y4. A fourth recessed surface 274 of the top wall 212 may have a vertical distance to the bottom wall 214 (and the support surface when positioned) of Y5. For example, the vertical distance Y1 may be greater than Y2. The first recessed surface 268 may be closer to the rim 216 than the second recessed surface 270, and, as such, the vertical distance Y2 may be greater than Y3. The second recessed surface 270 may be closer to the rim 216 than the third recessed surface 272, and, as such, the vertical distance Y3 may be greater than Y4. The third recessed surface 272 may be closer to the rim 216 than the fourth recessed surface 274, and, as such, the vertical distance Y4 may be greater than Y5.

For example, as best shown in FIG. 2C-2D, the top end of the rim 216 of the one or more side walls 202 may have a first vertical distance to the bottom wall 214 (and the support surface when positioned). A first raised surface 262 of the top wall 212 may have a second vertical distance to the bottom wall 214 (and the support surface when positioned). A second raised surface 264 of the top wall 212 may have a third vertical distance to the bottom wall 214 (and the support surface when positioned). A third raised surface 266 of the top wall 212 may have a fourth vertical distance to the bottom wall 214 (and the support surface when positioned).

For example, the first vertical distance may be greater than the second vertical distance. The first raised surface 262 may be closer to the rim 216 than the second raised surface 264, and, as such, the second vertical distance may be greater than the third vertical distance. The second raised surface 264 may be closer to the rim 216 than the third raised surface 266, and, as such, the third vertical distance may be greater than the fourth vertical distance.

The top wall 212 may comprise a plurality of apertures 218. For example, the plurality of apertures 218 may extend through the top wall 212 (e.g. from the top surface 231 to the bottom surface 232). For example, the plurality of apertures 218 may extend vertically through the top wall 212. The plurality of apertures 218 may provide a fluidic pathway from the interior cavity 230 of the housing 201 to the exterior of the housing 201 through the top wall 212.

For example, the plurality of apertures 218 may be randomly positioned along the top wall 212. For example, the plurality of apertures 218 may be organized in a plurality of rows 218a-c along the top wall 212. For example, the plurality of apertures 218 may be organized in a plurality of concentric shapes 218a-c along the top wall 218. For example, the concentric shape may be at least one of a circle, an oval, a square, a rectangle, a rounded square, a rounded rectangle, or a squircle.

For example, at least a portion 218d of the apertures 218 may be disposed in one or more of the recessed surfaces 268-274. For example, at least a portion 218e of the apertures 218 may be disposed on one or more of the angular surfaces 280-292 and below the level of the adjacent corresponding ridge or top of the raised surface 262-266.

For example, the top surface 231 of the top wall 212 may have a concave shape and the bottom surface 232 of the top wall 212 may be flat or planar.

The configuration of the top wall 212 in combination with the rim 216 and/or top end of the one or more side walls 202 provide a capability for the fluidic pathway from the interior of cavity 230 of the device 200 to an exterior of the device 200, via the apertures 218, to remain unblocked even when an object is placed along the rim 216 or top end of the one or more side walls 202 in such a manner that the object is positioned directly vertically above or all or at least a portion of the apertures 218. The space created between the bottom side of the object and the top surface 231 of the top wall 212 allows air to continue to flow through the apertures 218 from the interior cavity 230 of the device 200 and allows the device 200 to cool the interior components. The air may then move within the space created between the bottom side of the object and the top surface 231 of the top wall 212 to an area not covered by the object and move away from the device, as shown in FIG. 4B.

For example, when the object is placed along the rim 216 and covers at least a portion of the top wall 212, the bottom side of the object may contact the top edge of the rim 216 or top edge of the one or more side walls 202. Due to the vertical spacing caused by one or more of the top wall 212 being recessed and/or having a concave shape with respect to the rim 216 and the top end of the one or more side walls 202, air is not blocked and may continue to flow through the portion of the plurality of apertures 218 extending through the portion of the top wall 212 directly below/under the object. The air may then move along the area between the top surface 231 of the top wall 212 and the bottom side of the object to a portion of the top wall 212 that is not directly vertically below/under by the object and away from the top wall 212 of the device 200. As such, even the portion of the apertures 218 positioned directly vertically under/beneath the object may still continue to function as a fluidic path for removing heated air from the interior cavity 230 of the device 200 and may prevent or reduce the possibility of the device 200 overheating or suffering heat related damage due to a user placing the object on top of the device 200.

For examples where the object has a bottom side that is a non-flat surface or that is flexible or pliant and that may include at least a portion that extends down below the rim 216 and/or top end of the one or more side walls 202, at least a portion of the apertures 218 directly under/beneath the object may still continue to function as a fluidic path for removing air from the interior cavity 230 due to one or more of the top surface 231 of the top wall 212 being both recessed below the rim 216 and/or top end of the one or more side walls 202 and having a concave shape.

In addition, for objects having a very pliant or flexible bottom side (e.g., paper, tissue, etc.), additional features may be provided for allowing at least a portion of the apertures 218 directly below/under the object to continue to function as a fluidic path. For example, the top surface 231 of the top wall 212 may include a plurality raised surfaces and a plurality of recessed surfaces. Apertures 218 may be positioned within the plurality of recessed surfaces and/or along the transitions from the plurality of raised surfaces to the plurality of recessed surfaces along the top surface 231 of the top wall 212. For example, the flexible or pliant part of the bottom side of the object may contact the multiple raised surfaces of the top surface 231 of the top wall 212 and may be supported thereby. The support provided by the one or more raised surfaces may prevent the object from further obstructing the apertures 218 positioned in the recessed surfaces and the transitions between the raised surface and the recessed surface of the top surface 231. While the object is placed on the device 200, the apertures 218 in the recessed surfaces and/or in the transitions portions of the top surface 231 may not be blocked and, as such, air flowing through those apertures 218, under the object, is not blocked and may continue to flow through that portion of the plurality of apertures 218 extending through the portion of the top wall 212 directly vertically below/under the object. The air may then move along the channel defined by the space between two adjacent raised surfaces and along the area between the top surface 231 of the top wall 212 and the bottom side of the object to a portion of the top wall 212 that is not directly vertically below/under the object and away from the top wall 212 of the device 200. As such, even at least a portion of the apertures 218 positioned directly vertically under/below the object (e.g., those apertures 218 along the recessed surfaces and/or along the transition between the recessed surface and the raised surface along the top surface 231) may still continue to function as a fluidic path for removing heated air from the interior cavity 230 of the device 200 and may prevent or reduce the likelihood of the device 200 overheating or suffering heat related damage due to a user placing the object on top of the device 200.

FIGS. 3A-3D show various views of an example apparatus 300. The apparatus 300 may comprise a networking device 300. For example, the networking device 300 may comprise one or more of a router, an access point, a hub, a switch, a bridge, a gateway, or a modem. The networking device 300 may take the form of any three-dimensional shape that includes a cavity for housing one or more networking components.

Figure 3A:
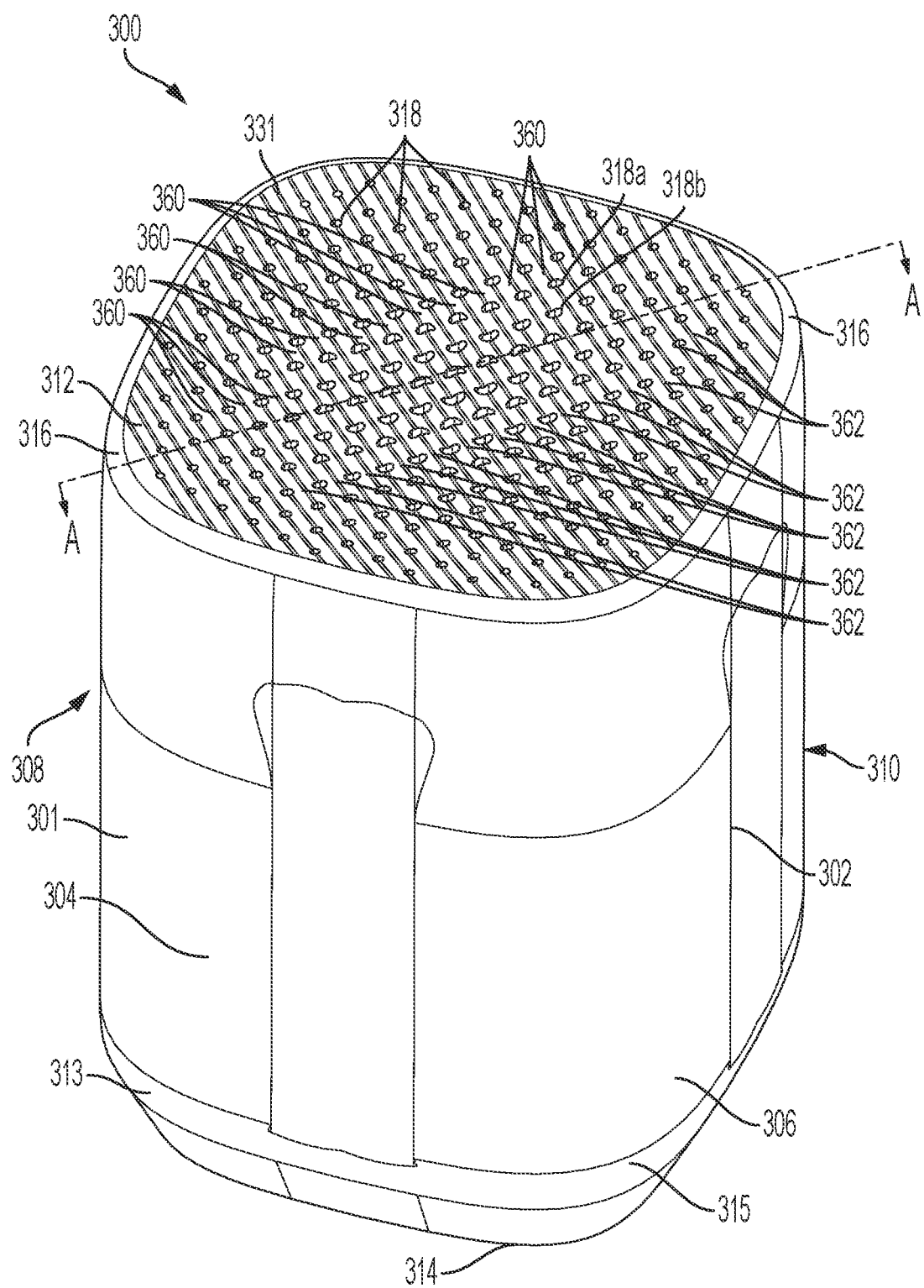
FIG. 3A shows a front perspective view of an example apparatus.
Figure 3B:
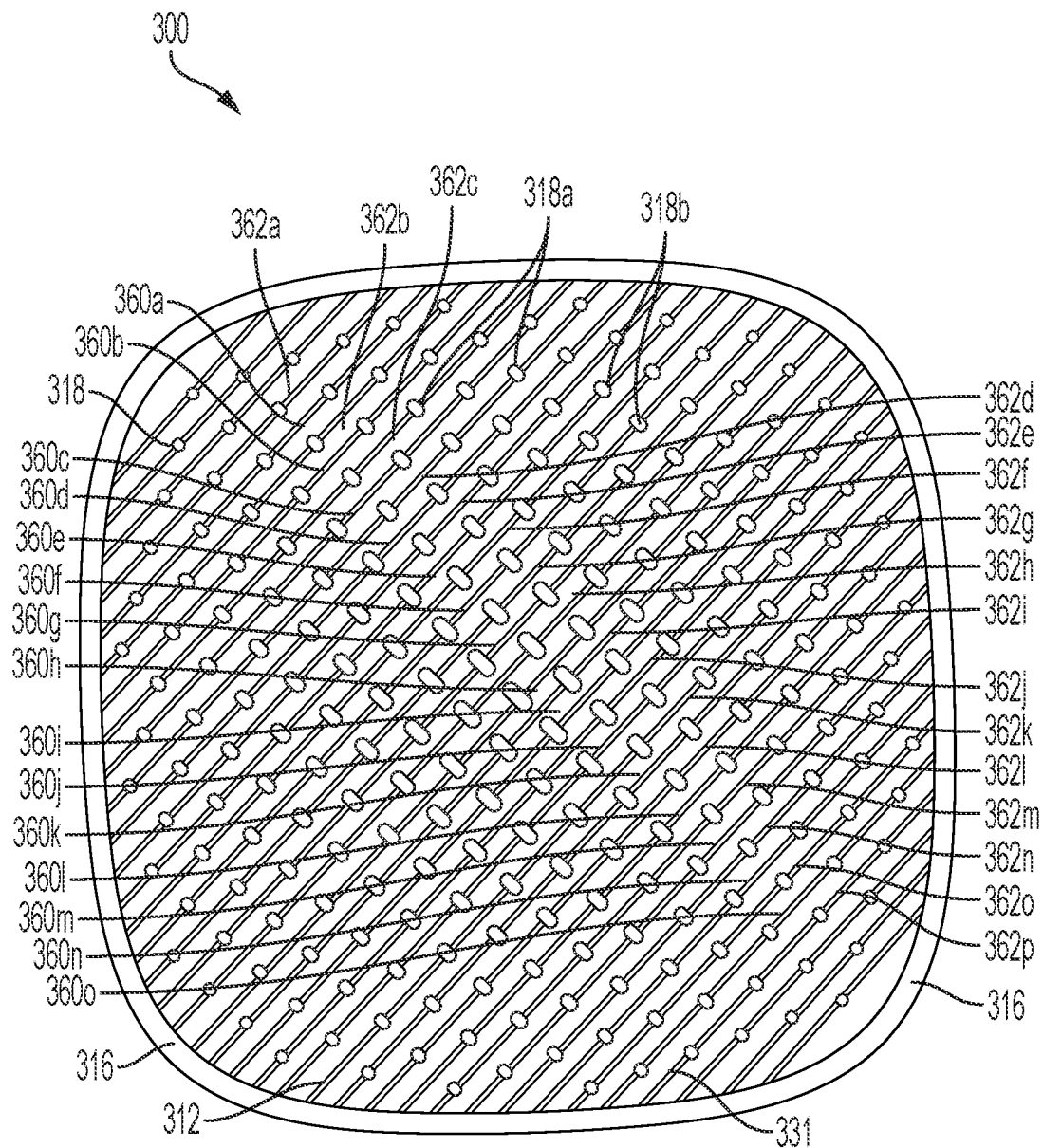
FIG. 3B shows a top plan view of the example apparatus.

The networking device 300 may comprise a housing 301. The housing 301 may be sized and shaped to receive therein one or more networking components for passing data from one device to another device (e.g., one computing device to another computing device). While the example housing 301 of FIG. 3A is shown as substantially a rectangular prism or squircular prism, this is for example purposes only. In other example embodiments, the housing 301 can have any other three-dimensional shape.

The housing 301 may comprise a base 313. The base 313 may comprises a bottom wall 314. The bottom wall 314 may be configured to contact a support surface, such as a table, floor, wall, or other surface. The bottom wall 314 may be flat or substantially flat. The base 313 may comprise an outer side wall 315. The outer side wall 315 may extend generally vertically upward from the bottom wall 314. The outer side wall 315 may comprise one or more side surfaces depending on the cross-sectional shape of the one or more side walls 302 of the housing 301. The base 313 may comprise one or more venting apertures (not shown but the same or substantially the same as that of 120 of FIG. 1A). For example, the base 313 may comprise a plurality of venting apertures extending around all or a portion of a perimeter of the outer side wall 315 adjacent to the bottom wall 314. For example, the plurality of venting apertures may be disposed between the bottom wall 314 and the outer side wall 315 of the base 313. Each venting aperture may comprise a linear opening that provides a fluidic pathway between an exterior of the network device 300 to an interior or cavity 330 of the network device 300. In other examples, each venting aperture may have any other shape.

The housing 301 may comprise one or more side walls 302. The one or more side walls 302 may extend vertically or substantially vertically upward from the base 313 (e.g., from the outer side wall 315 of the base 313). The number of side walls may be based on the cross-sectional shape of the housing 301. For example, a circular cross-section, may comprise a single side wall while a rectangular cross-section may comprise four side walls. Further, manufacturing capabilities may allow for combining two or more side walls into a unitary side wall for device construction purposes.

For example, the one or more side walls 302 may comprise a front side wall 304, a right side wall 306, a left side wall 308, and a rear side wall 310. The identification of side walls as front, left, right, and rear is for example purposes only and is not intended to limit the position or location of any elements described with reference to the one or more side walls 302. For example, the one or more side walls 302 may have a smooth outer surface. In other examples, all or a portion of the one or more side walls 302 may comprise a textured outer surface (e.g., ribbed, rough, a plurality of raised bumps, etc.). One or more (e.g., each) of the front side wall 304, right side wall 306, left side wall 308, and rear side wall 310 may extend from the base 302 to a side wall top end 316. The side wall top end 316 of each of the side walls 304-310 may be collectively referred to as a rim or side wall rim 316 and may be collectively disposed about all or at least a portion of a top wall 312.

For example, each of the one or more side walls 302 (e.g., the side walls 304-310) may be removably coupled to each other of the one or more side walls 302. For example, each of the one or more side walls 302 (e.g., side walls 304-310) may be removably coupled to the base 313. Each of the one or more side walls 302 may be made out of any known material, such as metal or plastic or a combination thereof. Each of the one or more side walls 302 may be planar, curved, or a combination thereof. Each of the one or more side walls 302 may have the same shape as each other one of the one or more side walls 302 or a different shape from one or more of the one or more side walls 302.

The rear side wall 310 may comprise one or more connection components for the network device 300. For example, the rear side wall 310 may comprise a power switch (not shown but the same or substantially similar to that of 122 of FIG. 1C). The power switch may selectively turn the network device 300 on and off based on a user depressing or otherwise actuating the power switch.

The rear side wall 310 may comprise an input port (not shown but the same or substantially similar to that of 126 of FIG. 1C) and an output port (not shown but the same or substantially similar to that of 124 of FIG. 1C). For example, each of the input port and the output port may comprise an Ethernet port. Each of the input port and the output port may comprise a cavity for receiving at least a portion of a connector. For example, the connector may be an Ethernet connector coupled to a wire.

The input port may be configured to perform the functionality of terminating an incoming physical link to the network device 300. The input port may be configured to perform a lookup and forwarding function so that a datagram forwarded to a switching fabric (not shown but the same or substantially similar to that of 144 of FIG. 1H) is sent to the correct output port. The output port may be configured to store datagrams that have been forwarded to it through the switching fabric and sends the datagrams on an outgoing link.

The rear side wall 310 may comprise a reset switch or button (not shown but the same or substantially similar to that of 128 of FIG. 1C). For example, the reset switch may selectively reset the network device 300 based on a user depressing or otherwise actuating the reset switch.

The housing 301 may comprise a cavity 330 or interior of the housing 301. For example, the cavity 330 may be defined by the base 313, the one or more side walls 302, and/or the top wall 312. The cavity 330 may define an empty space for receiving one or more components of the network device 300. For example, the cavity 330 may comprise one or more of the power switch, the output port, the input port, one or more processors (not shown but the same or substantially similar to that of 142 of FIG. 1H), the switching fabric (not shown but the same or substantially similar to that of 144 of FIG. 1H), memory (not shown but the same or substantially similar to that of 146 of FIG. 1H), a transmitter, receiver and/or transceiver (not shown but the same or substantially similar to that of 148 of FIG. 1H), and an antenna (not shown but the same or substantially similar to that of 150 of FIG. 1H).

The one or more processors may be communicably coupled to the switching fabric, the memory, the power switch, the input port, the output port, and the transceiver. The one or more processors may be configured to execute the commands and process the commands in an operating system of the network device 300, and execute the routing protocols for the network device 300. The one or more processors may be configured to maintain the routing tables and perform network management functions within the network device 300. In the case of multiple processors, the network device 300 may utilize parallel computing.

The switching fabric may be communicably coupled to the one or more processors, the memory, the transmitter/receiver/transceiver, the input port(s), and the output port(s). The switching fabric may be configured to connect the input port(s) to the output port(s) and may be configured to send datagrams received at one of the input port(s) to one of the output port(s).

The memory may comprise many forms of memory. For example, the memory may comprise read-only memory (ROM), random-access memory (RAM), flash memory, and/or nonvolatile RAM (NVRAM). The ROM may comprise the bootstrap program executed when the network device 300 is turned on. The RAM may comprise the executable file and running file of the configuration file for the network device 300. The flash memory may comprise the operating system for the network device 300. The operating system may be loaded onto RAM from the flash memory when the network device 300 is turned on or reset. The NVRAM may comprise a copy of the running configuration file for the network device 300.

The transmitter, receiver, and/or transceiver may be communicably coupled to the switching fabric, the processor and the antenna. The transmitter/receiver/transceiver may be configured to receive data and send data. For example, the transmitter/receiver/transceiver may be configured to wirelessly transmit data via any wireless protocol (e.g., Wi-Fi, LAN, WAN, Bluetooth, Bluetooth Low Energy (BLE), Zigbee, etc.). The cavity 330 of the network device 300 may include additional components not described herein. The nature and type of components may be based on the type of network device.

The housing 301 may comprise a top wall 312. The top wall 312 may be coupled (e.g., removably coupled) to one or more of the one or more side walls 302 (e.g., the side walls 304-310). The top wall 312 may comprise a top surface 331 and a bottom surface 332. The top surface 331 may be recessed below the rim defined by the top end 316 of the one or more side walls 302. For example, all or a portion of the top surface 331 may be recessed below the rim 316. For example, the top surface 331 may comprise a concave shape. For example, the top wall 312 (e.g., both the top surface 331 and the bottom surface 332) may comprise a concave shape. For example, the concave shape of the top surface 331 (or top wall 312) may be with respect to the exterior of the housing 301 adjacent the top wall 312.

The top surface 331 may comprise a plurality of raised surfaces 362a-p. The plurality of raised surfaces 362a-p may extend up from the concave top surface 331. For example, the plurality of raised surfaces 362a-p may extend in parallel rows along the top surface 331 of the top wall 312. For example, the plurality of raised surfaces 362a-p may extend linearly along the top surface 331 of the top wall 312.

For example, the plurality of raised surfaces 362a-p may comprise a plurality of ridges defining the highest vertical points along or the top edge along the plurality of raised surfaces 362a-p. For example, all or at least a portion of the top edge along each of the plurality raised surfaces 362a-p may be at a vertical position below that of the top of the rim 316. For example, all or at least a portion of the top edge along each of the plurality raised surfaces 362a-p may be at a vertical position below the top end 316 of at least one of the one or more side walls 302.

The top surface 331 may comprise a plurality of recessed surfaces 360a-o. The plurality of recessed surfaces 360a-o may be the concave top surface 331 or extend down into the concave top surface 331. For example, the plurality of recessed surfaces 360a-o may extend in parallel rows along the top surface 331 of the top wall 312. For example, the plurality of recessed surfaces 360a-o may extend linearly along the top surface 331 of the top wall 312.

For example, one or more or each of the plurality of raised surfaces 362a-p may be positioned between two of the plurality of recessed surfaces 360a-o. For example, the top surface 331 may comprise alternating raised surfaces 362a-p and recessed surfaces 360a-o. For example, the alternating raised surfaces 362a-p and recessed surfaces 360a-o may comprise a waveform or wave shape with a corresponding plurality of peaks and a plurality of troughs.

For example, all or at least a portion of the peak along each of the plurality raised surfaces 362a-p may be at a vertical position below that of the vertical position of the top of the rim 316. For example, all or at least a portion of the corresponding peak along each of the plurality raised surfaces 362a-p may be at a vertical position below the top end 316 of at least one of the one or more side walls 302.

The number of raised surfaces 362a-p and recessed surfaces 360a-o shown and described is for example only, as greater or fewer raised surfaces 362a-p and recessed surfaces 360a-o may be provided in other example embodiments.

For example, the peaks of the raised surfaces 362a-p closer to the rim 316 (e.g., the top end 316 of the one or more side walls 302) may have a vertical position that is higher/greater than the peaks of the raised surfaces 362a-p that are farther from the rim 316. For example, the troughs of the recessed surfaces 360a-o closer to the rim 316 (e.g., the top end 316 of the one or more side walls 302) may have a vertical position that is higher/greater than the troughs of the recessed surfaces 360a-o that are farther from the rim 316.

Figure 3C:
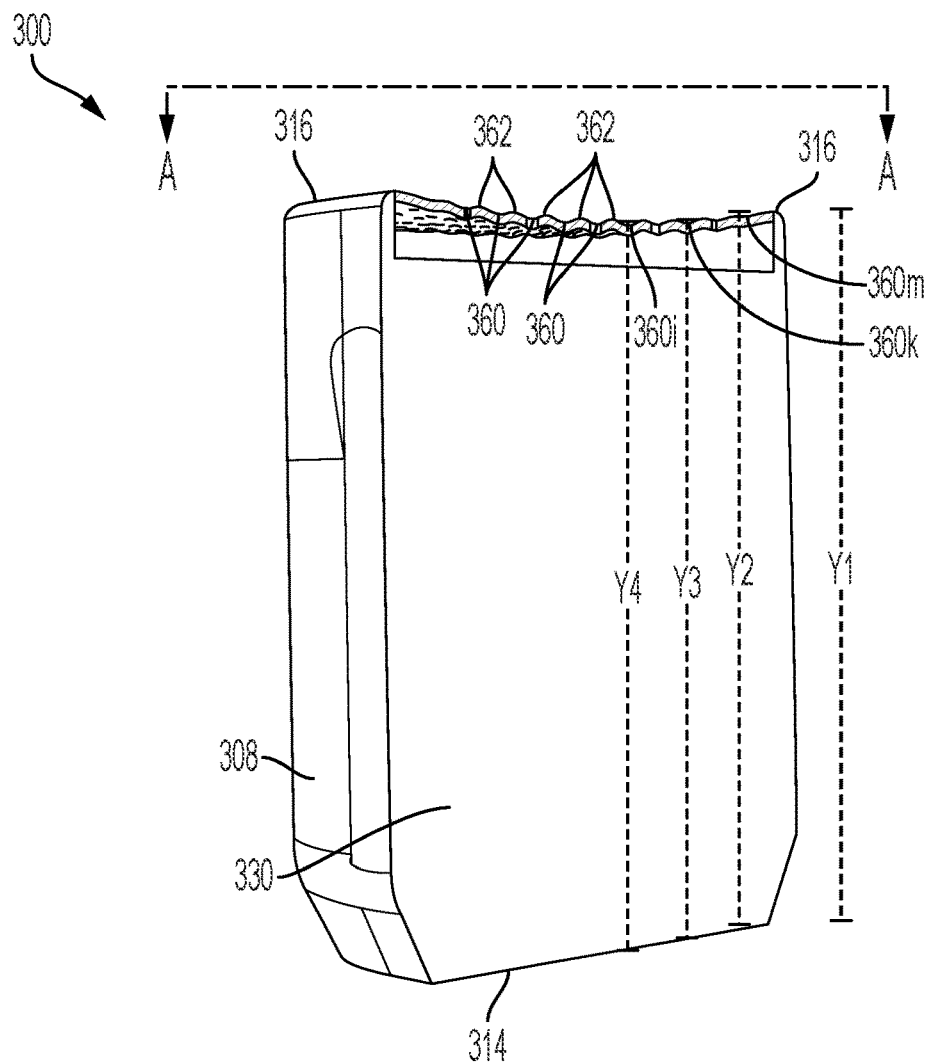
FIGS. 3C and 3D show a full and partial cross-sectional view of the example apparatus along the section A-A.
Figure 3D:
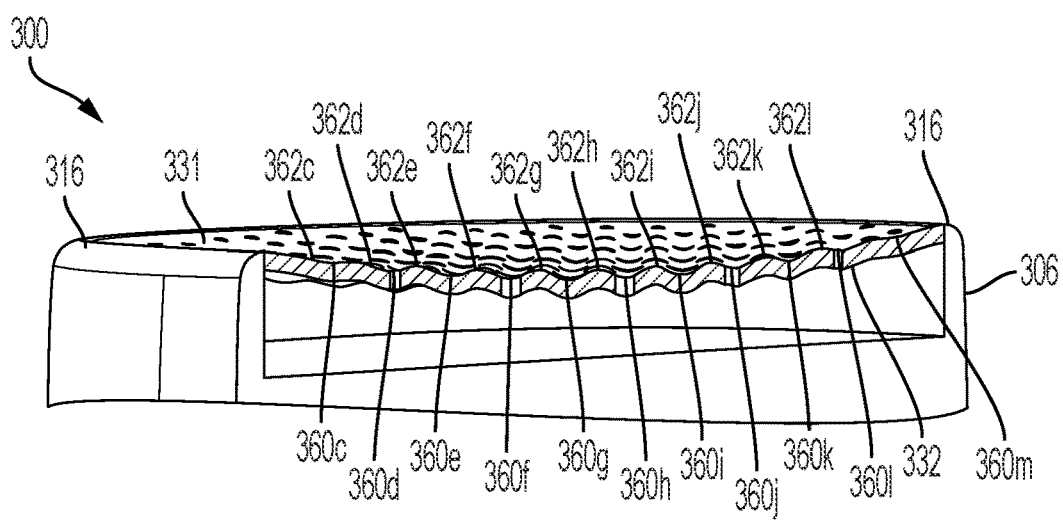

For example, FIGS. 3C and 3D are cross-sectional views of the network device 300 along the section A-A (see FIG. 3A). As best shown in FIG. 3C, the top end of the rim 316 of the one or more side walls 302 may have a vertical distance to the bottom wall 314 (and the support surface when positioned) of Y1. A first recessed surface or trough 360m of the top wall 312 may have a vertical distance to the bottom wall 314 (and the support surface when positioned) of Y2. A second recessed surface or trough 360k of the top wall 312 may have a vertical distance to the bottom wall 314 (and the support surface when positioned) of Y3. A third recessed surface or trough 360i of the top wall 312 may have a vertical distance to the bottom wall 314 (and the support surface when positioned) of Y4. For example, the vertical distance Y1 may be greater than Y2. The first recessed surface or trough 360m may be closer to the rim 316 than the second recessed surface or trough 360k, and, as such, the vertical distance Y2 may be greater than Y3. The second recessed surface or trough 360k may be closer to the rim 316 than the third recessed surface or trough 360i, and, as such, the vertical distance Y3 may be greater than Y4.

For example, as best shown in FIG. 3C-3D, the top end of the rim 316 of the one or more side walls 302 may have a first vertical distance to the bottom wall 314 (and the support surface when positioned). A first raised surface or peak 362c of the top wall 312 may have a second vertical distance to the bottom wall 314 (and the support surface when positioned). A second raised surface or peak 362d of the top wall 312 may have a third vertical distance to the bottom wall 314 (and the support surface when positioned). A third raised surface or peak 362e of the top wall 312 may have a fourth vertical distance to the bottom wall 314 (and the support surface when positioned).

For example, the first vertical distance may be greater than the second vertical distance. The first raised surface or peak 362c may be closer to the rim 316 than the second raised surface or peak 362d, and, as such, the second vertical distance may be greater than the third vertical distance. The second raised surface or peak 362d may be closer to the rim 316 than the third raised surface or peak 362e, and, as such, the third vertical distance may be greater than the fourth vertical distance.

The top wall 312 may comprise a plurality of apertures 318. For example, the plurality of apertures 318 may extend through the top wall 312 (e.g. from the top surface 331 to the bottom surface 332). For example, the plurality of apertures 318 may extend vertically through the top wall 312. The plurality of apertures 318 may provide a fluidic pathway from the interior cavity 330 of the housing 301 to the exterior of the housing 301 through the top wall 312.

For example, the plurality of apertures 318 may be randomly positioned along the top wall 312. For example, the plurality of apertures 318 may be organized in a plurality of rows 318a-b along the top wall 312. For example, at least a portion 318b of the apertures 318 may be disposed in or along one or more of the recessed surfaces or troughs 360a-o. For example, one or a plurality of at least the portion 318b of the apertures 318 may be disposed in or along each of the recessed surfaces or troughs 360a-o. For example, at least a portion 318a of the apertures 318 may be disposed in or along one or more of the raised surfaces or peaks 362a-p. For example, one or a plurality of at least the portion 318a of the apertures 318 may be disposed in or along each of the raised surfaces or peaks 362a-p.

For example, the top surface 331 of the top wall 312 may have a concave shape and the bottom surface 332 of the top wall 312 may be flat or planar.

The configuration of the top wall 312 in combination with the rim 316 and/or top end of the one or more side walls 302 provide a capability for the fluidic pathway from the interior of cavity 330 of the device 300 to an exterior of the device 300, via the apertures 318, to remain unblocked even when an object is placed along the rim 316 or top end of the one or more side walls 302 in such a manner that the object is positioned directly vertically above or all or at least a portion of the apertures 318. The space created between the bottom side of the object and the top surface 331 of the top wall 312 allows air to continue to flow through the apertures 318 from the interior cavity 330 of the device 300 and allows the device 300 to cool the interior components. The air may then move within the space created between the bottom side of the object and the top surface 331 of the top wall 312 to an area not covered by the object and move away from the device, as shown in FIG. 4B.

For example, when the object is placed along the rim 316 and covers at least a portion of the top wall 312, the bottom side of the object may contact the top edge of the rim 316 or top edge of the one or more side walls 302. Due to the vertical spacing caused by one or more of the top wall 312 being recessed and/or having a concave shape with respect to the rim 316 and the top end of the one or more side walls 302, air is not blocked and may continue to flow through the portion of the plurality of apertures 318 extending through the portion of the top wall 312 directly below/under the object. The air may then move along the area between the top surface 331 of the top wall 312 and the bottom side of the object to a portion of the top wall 312 that is not directly vertically below/under by the object and away from the top wall 312 of the device 300. As such, even the portion of the apertures 318 positioned directly vertically under/beneath the object may still continue to function as a fluidic path for removing heated air from the interior cavity 330 of the device 300 and may prevent or reduce the possibility of the device 300 overheating or suffering heat related damage due to a user placing the object on top of the device 300.

For examples where the object has a bottom side that is a non-flat surface or that is flexible or pliant and that may include at least a portion that extends down below the rim 316 and/or top end of the one or more side walls 302, at least a portion of the apertures 318 directly under/beneath the object may still continue to function as a fluidic path for removing air from the interior cavity 330 due to one or more of the top surface 331 of the top wall 312 being both recessed below the rim 316 and/or top end of the one or more side walls 302 and having a concave shape.

In addition, for objects having a very pliant or flexible bottom side (e.g., paper, tissue, etc.), additional features may be provided for allowing at least a portion of the apertures 318 directly below/under the object to continue to function as a fluidic path. For example, the top surface 331 of the top wall 312 may include a plurality raised surfaces and a plurality of recessed surfaces. Apertures 318 may be positioned within the plurality of recessed surfaces and/or along the transitions from the plurality of raised surfaces to the plurality of recessed surfaces along the top surface 331 of the top wall 312. For example, the flexible or pliant part of the bottom side of the object may contact the multiple raised surfaces of the top surface 331 of the top wall 312 and may be supported thereby. The support provided by the one or more raised surfaces may prevent the object from further obstructing the apertures 318 positioned in the recessed surfaces and the transitions between the raised surface and the recessed surface of the top surface 331. While the object is placed on the device 300, the apertures 318 in the recessed surfaces and/or in the transitions portions of the top surface 331 may not be blocked and, as such, air flowing through those apertures 318, under the object, is not blocked and may continue to flow through that portion of the plurality of apertures 318 extending through the portion of the top wall 312 directly vertically below/under the object. The air may then move along the channel defined by the space between two adjacent raised surfaces and along the area between the top surface 331 of the top wall 312 and the bottom side of the object to a portion of the top wall 312 that is not directly vertically below/under the object and away from the top wall 312 of the device 300. As such, even at least a portion of the apertures 318 positioned directly vertically under/below the object (e.g., those apertures 318 along the recessed surfaces and/or along the transition between the recessed surface and the raised surface along the top surface 331) may still continue to function as a fluidic path for removing heated air from the interior cavity 330 of the device 300 and may prevent or reduce the likelihood of the device 300 overheating or suffering heat related damage due to a user placing the object on top of the device 300.

Figure 4A:
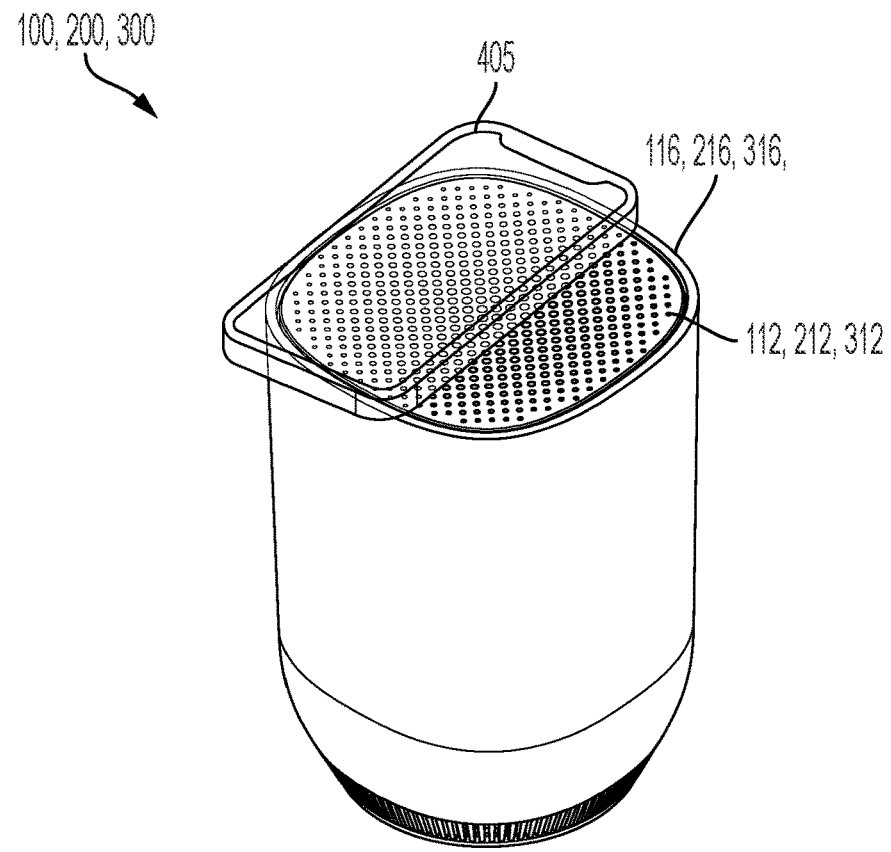
FIG. 4A shows a perspective view of the example apparatus.
Figure 4B:
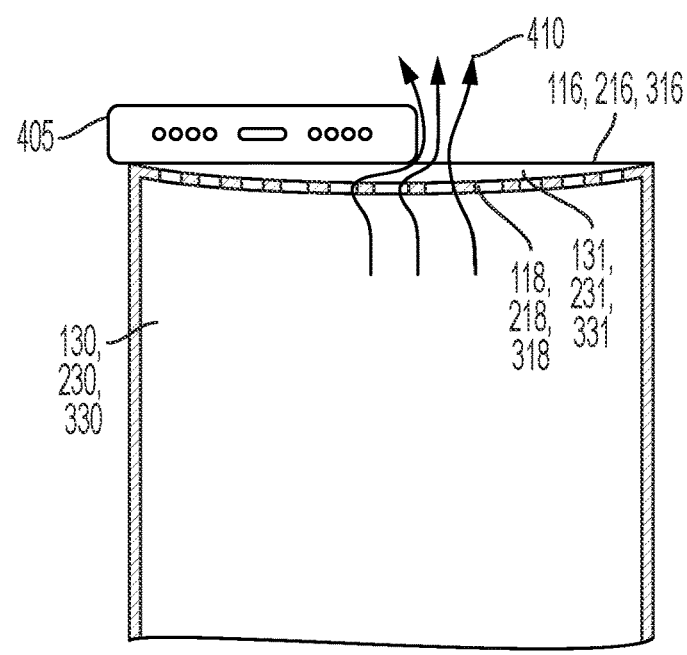
FIG. 4B shows a cross-section view of the example apparatus.

FIGS. 4A and 4B are perspective and elevation views of the example apparatuses 100, 200, 300 of FIGS. 1A-3D. The example apparatuses 100, 200, 300 may comprise the network device 100, 200, 300. The network device 100, 200, 300 may comprise the housing 101, 201, 301. The housing 101, 201, 301 may comprise the top wall 112, 212, 312 and the rim or top end of the one or more side walls 116, 216, 316. The top wall 112, 212, 312 may comprise the top surface 131, 231, 331 recessed or disposed below the top of the rim 116, 216, 316. The top wall 112, 212, 312 may comprise the plurality of apertures 118, 218, 318.

When an object 405 (e.g., a user device, such as a phone or tablet computer, a piece of paper, a magazine, a cup, or any other object) is laid across the top of the network device 100, 200, 300, (e.g., along the top end of the one or more side walls 102, 202, 302 or rim 116, 216, 316) the object 405 may contact the rim 116, 216, 316 at multiple points (e.g., along multiple sides of the rim 116, 216, 316 or top ends of the one or more side walls 102, 202, 302). Because of the space created between the bottom side of the object 405 and the top side 131, 231, 331 of the top wall 112, 212, 312 (e.g., due to the top wall 112, 212, 312 being recessed or concave-shaped and below the top end of the one or more side walls 102, 202, 302 or rim 116, 216, 316) the one or more of the plurality of apertures 118, 218, 318 and the fluidic path from an interior of the housing 101, 201, 301, to an exterior of the housing 101, 201, 301 through one or more of the plurality of apertures 118, 218, 318 are not blocked by the object laying across the top of the network device 100, 200, 300, due to the space between the rim 116, 216, 316 and the top surface 131, 231, 331.

For example, when the object 405 is placed along the rim 116, 216, 316 and covers at least a portion of the top wall 112, 212, 312, the bottom side of the object 405 may contact the top edge of the rim 116, 216, 316, or top edge of the one or more side walls 102, 202, 302. Due to the vertical spacing caused by one or more of the top wall 112, 212, 312 being recessed and/or having a concave shape with respect to the rim 116, 216, 316 and the top end of the one or more side walls 102, 202, 302, air 410 is not blocked and may continue to flow through the portion of the plurality of apertures 118, 218, 318 extending through the portion of the top wall 112, 212, 312 directly vertically below/under the object 405. The air 410 may then move along the area between the top surface 131, 231, 331 of the top wall 112, 212, 312 and the bottom side of the object 405 to a portion of the top wall 112, 212, 312, that is not directly vertically below/under the object 405 and away from the top wall 112, 212, 312 of the device 100, 200, 300. As such, even the portion of the apertures 118, 218, 318 positioned under/beneath the object 405 may still continue to function as a fluidic path for removing heated air from the interior cavity 130, 230, 330 of the device 100, 200, 300 and may prevent the device 100, 200, 300 from overheating or suffering heat related damage due to a user placing the object 405 on top of the device 100, 200, 300.

For examples where the object 405 has a bottom side that is a non-flat surface or that is flexible or pliant and that may include at least a portion that extends down below the rim 116, 216, 316, and/or top end of the one or more side walls 102, 202, 302 at least a portion of the apertures 118, 218, 318 directly vertically below/under the object 405 may still continue to function as a fluidic path for removing air from the interior cavity 130, 230, 330 due to the combination of the top surface 131, 231, 331 of the top wall 112, 212, 312 being both recessed below the rim 116, 216, 316 and/or top end of the one or more side walls 102, 202, 302 and having a concave shape.

In addition, for objects having a very pliant or flexible bottom side (e.g., paper, tissue, etc.), additional features may be provided for allowing at least a portion of the apertures 118, 218, 318 directly vertically below/under the object 405 to continue to function as a fluidic path. For example, the top surface 131, 232, 331 of the top wall 112, 212, 312 may include a plurality raised surfaces and a plurality of recessed surfaces. Apertures 118, 218, 318 may be positioned within the plurality of recessed surfaces and/or along the transitions from the plurality of raised surfaces to the plurality of recessed surfaces along the top surface 131, 231, 331 of the top wall 112, 212, 312. For example, the flexible or pliant part of the bottom side of the object 405 may contact the multiple raised surfaces of the top surface 131, 231, 331, of the top wall 112, 212, 312 and may be supported thereby. The support provided by the one or more raised surfaces may prevent the object from further obstructing the apertures 118, 218, 318, positioned in the recessed surfaces and the transitions between the raised surface and the recessed surface of the top surface 131, 231, 331. While the object 405 is placed on the device 100, 200, 300, the apertures 118, 218, 318 in the recessed surfaces and/or in the transitions portions of the top surface 131, 231, 331 may not be blocked and, as such, air 410 flowing through those apertures 118, 218, 318, under the object 405, is not blocked and may continue to flow through that portion of the plurality of apertures 118, 218, 318 extending through the portion of the top wall 112, 212, 312 directly vertically below/under the object 405. The air 410 may then move along the channel defined by the space between two adjacent raised surfaces and along the area between the top surface 131, 231, 331 of the top wall 112, 212, 312 and the bottom side of the object 405 to a portion of the top wall 112, 212, 312, that is not directly vertically below/under the object 405 and away from the top wall 112, 212, 312 of the device 100, 200, 300. As such, even at least a portion of the apertures 118, 218, 318 positioned under/beneath the object 405 (e.g., those apertures 118, 218, 318 along the recessed surfaces and/or along the transition between the recessed surface and the raised surface along the top surface 131, 231, 331) may still continue to function as a fluidic path for removing heated air from the interior cavity 130, 230, 330 of the device 100, 200, 300 and may prevent the device 100, 200, 300 from overheating or suffering heat related damage due to a user placing the object 405 on top of the device 100, 200, 300.

FIG. 5 shows a flowchart of an example method 500 for cooling a device. The methods described in FIG. 5 may be completed by a device. For example, the device may be a networking device 100, 200, 300. For example, the networking device 100, 200, 300 may comprise one or more of a router, an access point, a hub, a switch, a bridge, a gateway, or a modem.

At 510, data may be processed. For example, the data may be processed by the networking device 100, 200, 300. For example, the data may comprise data received by the networking device 100, 200, 300 from one or more computing devices. The one or more computing devices may comprise user devices (e.g., a mobile phone, a laptop computer, a desktop computer, a smart watch, a smart device, or the like). For example, the data may be received wirelessly by the networking device 100, 200, 300. For example, the data may comprise data to be sent by the networking device 100, 200, 300. For example, the data to be sent may be sent to the one or more computing devices. For example, the data to be sent may be sent wirelessly by the networking device 100, 200, 300. For example, the networking device 100, 200, 300 may comprise a housing defining a cavity (e.g., cavity 130, 230, 330). For example, while processing data, the network device 100, 200, 300, may generate hear within the cavity 130, 230, 330.

At 520, a temperature of the networking device 100, 200, 300 may be determined to satisfy a temperature threshold. For example, the temperature may be the temperature within all or a portion of the cavity 130, 230, 330 of the networking device 100, 200, 300. For example, the temperature threshold may be a pre-set temperature threshold. For example, the networking device 100, 200, 300, may comprise a thermal sensor positioned within the cavity 130, 230, 330. The thermal sensor may be configured to monitor the temperature within the cavity 130, 230, 330. The thermal sensor may be communicably coupled to the processor 142 (of FIG. 1H) or another processor of the networking device 100, 200, 300. For example, the temperature may satisfy the temperature threshold if the temperature is greater than or greater than or equal to the temperature threshold.

At 530, a fan may be activated. For example, the fan may be activated based on the temperature satisfying the temperature threshold. For example, the fan may be positioned within the cavity 130, 230, 330 of the networking device 100, 200, 300. For example, the fan may be communicably coupled to the processor 142 (of FIG. 1H) or another processor of the networking device 100, 200, 300. For example, the fan may be configured to cause air within the cavity 130, 230, 330, to exit the housing of the networking device 100, 200, 300 via the plurality of apertures 118, 218, 318 extending through the top wall 112, 212, 312.

For example, the fan may be configured to generate an airflow within the cavity 130, 230, 330 of the networking device 100, 200, 300, to move or push air (e.g., through pressurization) from within the cavity 130, 230, 330 along a fluidic path from within the housing, through all or a portion of the plurality of apertures 118, 218, 318, and to an exterior of the device 100, 200, 300. One or more objects (e.g., object 405) may be positioned/placed on or along the top of the networking device 100, 200, 300. For example, the one or more objects 405, may be positioned/resting along the rim 116, 216, 316 and/or top end of the one or more side walls 102, 202, 302 of the networking device 100, 200, 300. For example, the one or more objects 405 may be positioned above at least a portion of the top wall 112, 212, 312 of the networking device 100, 200, 300 and above at least the portion of the plurality of apertures 118, 218, 318 extending through that portion of the top wall 112, 212, 312. For example, the airflow from the interior or cavity 130, 230, 330 of the housing of the networking device 100, 200, 300, is not blocked from passing through the at least the portion of the plurality of ventilation apertures 118, 218, 318 that are directly below/under the one or more objects 405 due to the object 405 being positioned on the top end of the at least one side wall 102, 202, 302 or rim 116, 216, 316 and above the at least the portion of the top wall 112, 212, 312 that includes the portion of the plurality of ventilation apertures 118, 218, 318 due to the space created between the bottom side of the object(s) 405 and the top surface 131, 231, 331 of the top wall 112, 212, 312.

For example, when the object 405 is placed along the rim 116, 216, 316 and covers at least a portion of the top wall 112, 212, 312, the bottom side of the object 405 may contact the top edge of the rim 116, 216, 316, or top edge of the one or more side walls 102, 202, 302. Due to the vertical spacing caused by one or more of the top wall 112, 212, 312 being recessed and/or having a concave shape with respect to the rim 116, 216, 316 and the top end of the one or more side walls 102, 202, 302, air 410 is not blocked and may continue to flow through the portion of the plurality of apertures 118, 218, 318 extending through the portion of the top wall 112, 212, 312 directly below/under the object 405. The air 410 may then move along the area between the top surface 131, 231, 331 of the top wall 112, 212, 312 and the bottom side of the object 405 to a portion of the top wall 112, 212, 312, that is not directly vertically below/under by the object 405 and away from the top wall 112, 212, 312 of the device 100, 200, 300. As such, even the portion of the apertures 118, 218, 318 positioned under/beneath the object 405 may still continue to function as a fluidic path for removing heated air from the interior cavity 130, 230, 330 of the device 100, 200, 300 and may prevent the device 100, 200, 300 from overheating or suffering heat related damage due to a user placing the object 405 on top of the device 100, 200, 300.

For examples where the object 405 has a bottom side that is a non-flat surface or that is flexible or pliant and that may include at least a portion that extends down below the rim 116, 216, 316, and/or top end of the one or more side walls 102, 202, 302 at least a portion of the apertures 118, 218, 318 directly under/beneath the object 405 may still continue to function as a fluidic path for removing air from the interior cavity 130, 230, 330 due to the combination of the top surface 131, 231, 331 of the top wall 112, 212, 312 being both recessed below the rim 116, 216, 316 and/or top end of the one or more side walls 102, 202, 302 and having a concave shape.

In addition, for objects having a very pliant or flexible bottom side (e.g., paper, tissue, etc.), additional features may be provided for allowing at least a portion of the apertures 118, 218, 318 directly below/under the object 405 to continue to function as a fluidic path. For example, the top surface 131, 232, 331 of the top wall 112, 212, 312 may include a plurality raised surfaces and a plurality of recessed surfaces. Apertures 118, 218, 318 may be positioned within the plurality of recessed surfaces and/or along the transitions from the plurality of raised surfaces to the plurality of recessed surfaces along the top surface 131, 231, 331 of the top wall 112, 212, 312. For example, the flexible or pliant part of the bottom side of the object 405 may contact the multiple raised surfaces of the top surface 131, 231, 331, of the top wall 112, 212, 312 and may be supported thereby. The support provided by the one or more raised surfaces may prevent the object from further obstructing the apertures 118, 218, 318, positioned in the recessed surfaces and the transitions between the raised surface and the recessed surface of the top surface 131, 231, 331. While the object 405 is placed on the device 100, 200, 300, the apertures 118, 218, 318 in the recessed surfaces and/or in the transitions portions of the top surface 131, 231, 331 may not be blocked and, as such, air 410 flowing through those apertures 118, 218, 318, under the object 405, is not blocked and may continue to flow through that portion of the plurality of apertures 118, 218, 318 extending through the portion of the top wall 112, 212, 312 directly vertically below/under the object 405. The air 410 may then move along the channel defined by the space between two adjacent raised surfaces and along the area between the top surface 131, 231, 331 of the top wall 112, 212, 312 and the bottom side of the object 405 to a portion of the top wall 112, 212, 312, that is not directly vertically below/under the object 405 and away from the top wall 112, 212, 312 of the device 100, 200, 300. As such, even at least a portion of the apertures 118, 218, 318 positioned directly vertically under/below the object 405 (e.g., those apertures 118, 218, 318 along the recessed surfaces and/or along the transition between the recessed surface and the raised surface along the top surface 131, 231, 331) may still continue to function as a fluidic path for removing heated air from the interior cavity 130, 230, 330 of the device 100, 200, 300 and may prevent the device 100, 200, 300 from overheating or suffering heat related damage due to a user placing the object 405 on top of the device 100, 200, 300.

For example, the fan may also be configured to cause air within the cavity 130, 230, 330 to exit the housing of the networking device 100, 200, 300, through venting apertures (e.g., the venting apertures 120 of FIG. 1A) along the base 113 of the networking device 100, 200, 300.

While specific methods and configurations have been described, it is not intended that the scope be limited to the particular methods and configurations set forth, as the methods and configurations herein are intended in all respects to be possible methods and configurations rather than restrictive.

Unless otherwise expressly stated, it is in no way intended that any method or apparatus set forth herein be construed as requiring all of the elements presented herein. Further, it is in no way intended that any method or apparatus set forth herein be construed as being limited to the elements specifically described with regard to that particular method and/or apparatus. Further, any of the elements described with regard to one apparatus or method may be included with and/or substituted for one or more elements described with reference to any another apparatus or method described herein. As such any of the elements described herein may be used with and incorporated into any of the apparatuses and methods described herein.

It will be apparent to those skilled in the art that various modifications and variations may be made without departing from the scope or spirit. Other configurations will be apparent to those skilled in the art from consideration of the specification and practice described herein. It is intended that the specification and described configurations be considered as exemplary only, with a true scope and spirit being indicated by the following claims.

What is claimed is:

1. A network device comprising:
   a housing comprising:
      at least one side wall;
      a top wall comprising a top surface recessed below a top end of the at least one side wall, the top surface comprising a plurality of raised surfaces, wherein a top of each of the plurality of raised surfaces is below the top end of the at least one side wall; and
      a cavity defined by the top wall and the at least one side wall, wherein the top wall comprises a plurality of ventilation apertures extending from an exterior of the housing into the cavity,
   wherein airflow from an interior of the housing through the plurality of ventilation apertures is not blocked when an object is positioned on the top end of the at least one side wall and above at least a portion of the top wall of the housing.

2. The network device of claim 1, wherein the top surface of the top wall is concave-shaped with respect to the exterior of the housing adjacent the top wall.

3. The network device of claim 1, wherein the top surface further comprises:
   the plurality of raised surfaces; and
   a plurality of recessed surfaces, wherein each recessed surface of the plurality of recessed surfaces is disposed between a pair of raised surfaces of the plurality of raised surfaces.

4. The network device of claim 3, wherein at least a portion of the plurality of ventilation apertures are located along the plurality of recessed surfaces.

5. The network device of claim 3, wherein the plurality of raised surfaces are concentric.

6. The network device of claim 5, wherein each of the plurality of raised surfaces are disposed on the top surface in a shape of at least one of: a circle, a square, a rectangle, a rounded square, a rounded rectangle, an oval, or a squircle.

7. The network device of claim 1, wherein the network device is at least one of:
   a router, an access point, a hub, a switch, a bridge, a gateway, or a modem.

8. The network device of claim 1, wherein the plurality of raised surfaces extend linearly along the top surface of the top wall.

9. The network device of claim 1, wherein at least a portion of the top surface comprises a wave shape comprising:
   a plurality of peaks; and
   a plurality of troughs, wherein at least a portion of the plurality of ventilation apertures are located in the plurality of troughs of the top surface.

10. The network device of claim 1, further comprising a base comprising a bottom wall configured to contact a support surface, wherein the at least one side wall extends upward from the base.

11. A network device comprising:
    a housing comprising:
       at least one side wall;
       a top wall comprising:
          a concave-shaped top surface, wherein at least a portion of the concave-shaped top surface is positioned at a height vertically below a top end of the at least one side wall; and
          a plurality of ventilation apertures extending through the concave-shaped top surface; and
       a cavity defined by the top wall and the at least one side wall, wherein the plurality of ventilation apertures provide a fluidic pathway through the top wall and between the cavity and an exterior of the housing, through the top wall,
    wherein airflow through the fluidic pathway of the plurality of ventilation apertures is not blocked when an object is positioned on the top end of the at least one side wall and above at least a portion of the top wall of the housing.

12. The network device of claim 11, wherein the network device is at least one of:
    a router, an access point, a hub, a switch, a bridge, a gateway, or a modem.

13. The network device of claim 11, wherein the top surface comprises:
    a plurality of raised surfaces; and
    a plurality of recessed surfaces, wherein at least a portion of the plurality of ventilation apertures are disposed along one or more of the plurality of recessed surfaces.

14. The network device of claim 13, wherein a top of at least a portion of the plurality of raised surfaces is disposed below the top end of the at least one side wall.

15. The network device of claim 13, wherein each of the plurality of raised surfaces comprises a peak and each of the plurality of recessed surfaces comprises a trough.

16. A network device comprising:
    a base;
    at least one side wall;
    a top wall comprising:
       a plurality of raised surfaces;
       a plurality of recessed surfaces, wherein each of the plurality of raised surfaces and the plurality of recessed surfaces is positioned at a height vertically below a top end of the at least one side wall; and a plurality of ventilation apertures disposed along at least a portion of the plurality of recessed surfaces and extending through a top surface into a chamber defined by the base, the at least one side wall, and the top wall, wherein the base, the at least one side wall, and the at least one top wall define an interior and wherein airflow from the interior through the plurality of ventilation apertures is not blocked when an object is positioned on the top end of the at least one side wall and above at least a portion of the top wall.

17. The network device of claim 16, wherein the network device is at least one of:

a router, an access point, a hub, a switch, a bridge, a gateway, or a modem.

18. The network device of claim 16, wherein the plurality of raised surfaces and the plurality of recessed surfaces are disposed along a concave-shaped portion of the top wall.

19. The network device of claim 16, wherein at least a portion of the plurality of ventilation apertures are located along the plurality of recessed surfaces.

\* \* \* \* \*